United States Patent [19]
Warner, Jr.

[11] 3,994,012
[45] Nov. 23, 1976

[54] PHOTOVOLTAIC SEMI-CONDUCTOR DEVICES

[75] Inventor: Raymond M. Warner, Jr., Edina, Minn.

[73] Assignee: The Regents of the University of Minnesota, Minneapolis, Minn.

[22] Filed: Feb. 17, 1976

[21] Appl. No.: 658,307

Related U.S. Application Data

[63] Continuation-in-part of Ser. No. 575,258, May 7, 1975.

[52] U.S. Cl. .................................. 357/30; 357/4; 357/20; 357/49; 357/89
[51] Int. Cl.² .................. H01L 27/14; H01L 27/12
[58] Field of Search .............. 357/30, 4, 20, 89, 49, 357/50

[56] References Cited
UNITED STATES PATENTS

| | | | |
|---|---|---|---|
| 3,509,433 | 4/1970 | Schweder | 317/234 |
| 3,579,391 | 5/1971 | Buie | 148/175 |
| 3,598,664 | 8/1971 | Kilby | 148/175 |
| 3,666,548 | 5/1972 | Brack | 117/212 |
| 3,761,326 | 9/1973 | Weckler | 148/175 |
| 3,829,889 | 8/1974 | Allison | 357/49 |
| 3,836,793 | 9/1974 | Haitz | 307/303 |
| 3,877,052 | 4/1975 | Dixon | 357/17 |
| 3,886,587 | 5/1975 | Newlay | 357/49 |
| 3,896,485 | 7/1975 | Eurly | 357/24 |
| 3,943,555 | 3/1976 | Mueller | 357/49 |

*Primary Examiner*—Martin H. Edlow
*Attorney, Agent, or Firm*—Merchant, Gould, Smith, Edell, Welter & Schmidt

[57] ABSTRACT

Apparatus and method for constructing by means of standard high-yield microelectronic batch fabrication processes, reliable, monolithic high-voltage photovoltaic cells and highly efficient photovoltaic arrays therewith. A thin layer of single-crystalline semiconductor material containing a plurality of sublayers defining one or more active junctions in planes parallel to an upper irradiated surface thereof, overlies a supportive insulating substrate body. Widely spaced pairs of elongate heavily doped zones of opposite conductivity types produced by two short diffusion steps extend into the thin layer, defining photovoltaic cells therebetween and providing low-impedance conductive paths for photovoltaic carriers generated in the thin layer to the upper irradiated surface. By overlapping opposite-conductivity pairs of the heavily doped elongate zones, simultaneous dielectric isolation and series connection of adjacent cells is achieved. The elongate zones of individual cells can be interdigitated to decrease parasitic series resistance of the cells. A dielectric barrier interposed between adjacent cells can also be used to isolate the cells from one another. Means for creating an inversion layer at the irradiated surface, reflective means for causing multiple passes of received solar energy through the photovoltaic devices and use of an underlying junction formed by heavily and lightly doped regions of the same conductivity type can readily be employed to further increase cell efficiency.

59 Claims, 44 Drawing Figures

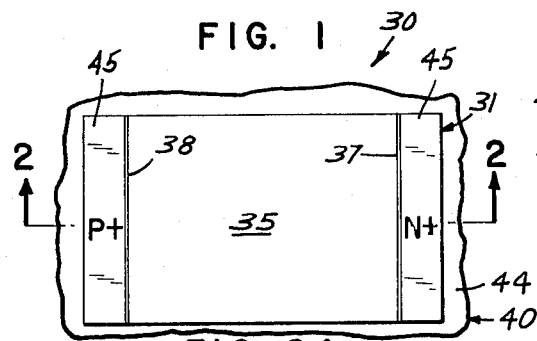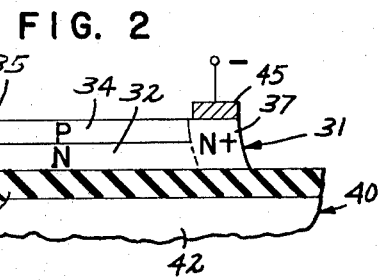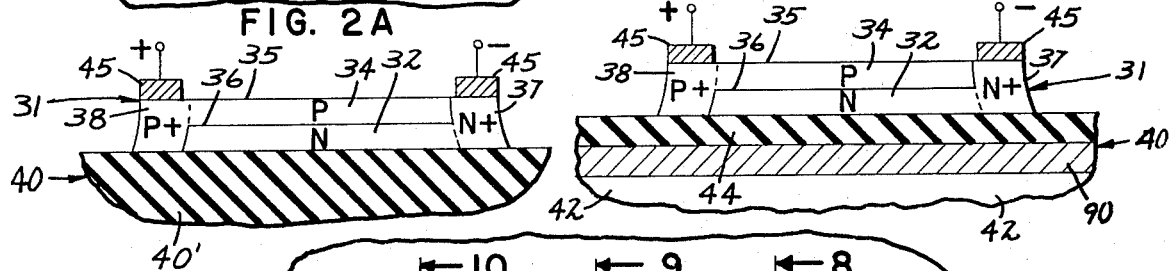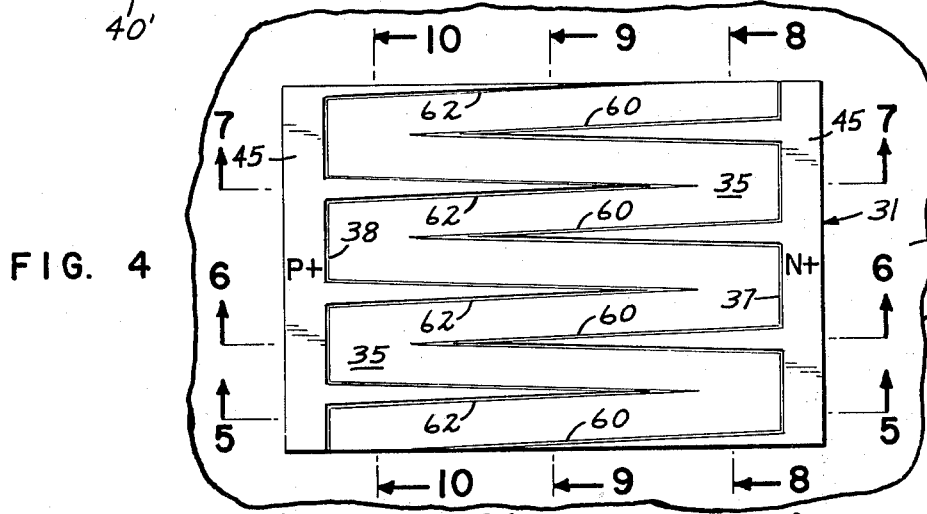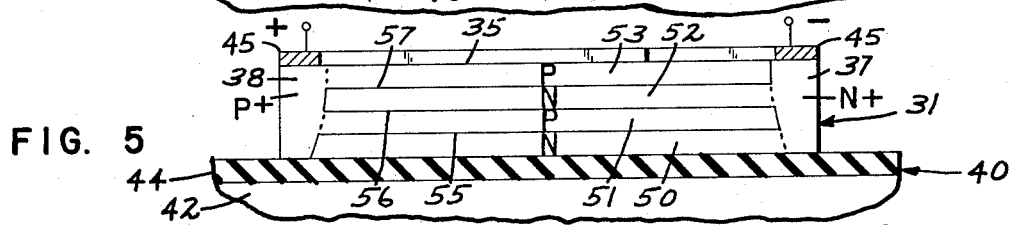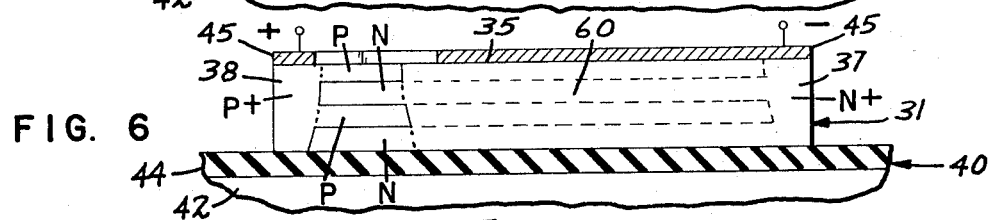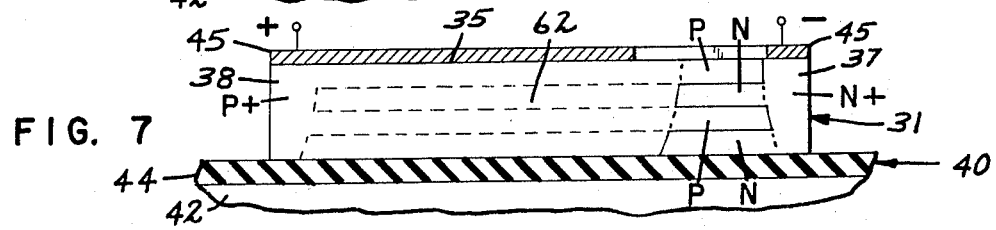

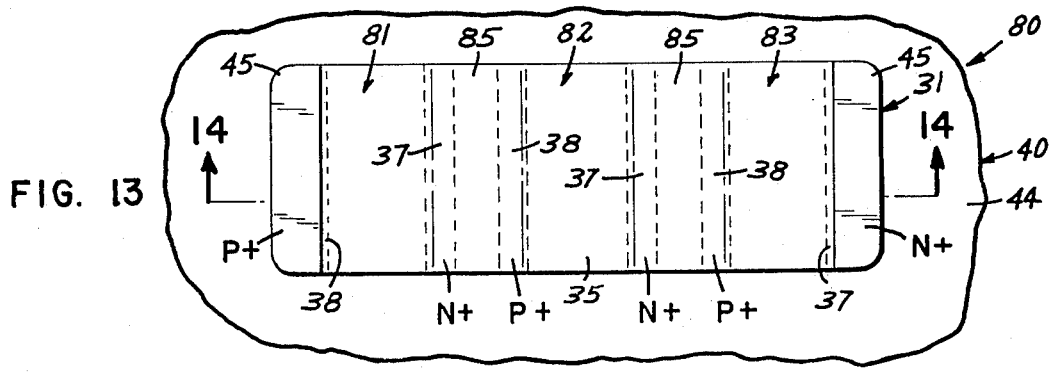
FIG. 13
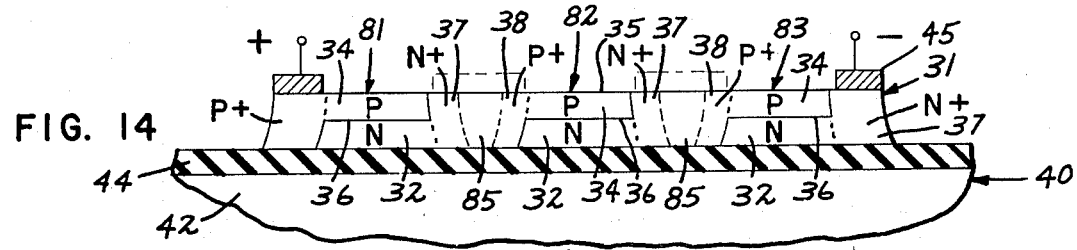
FIG. 14
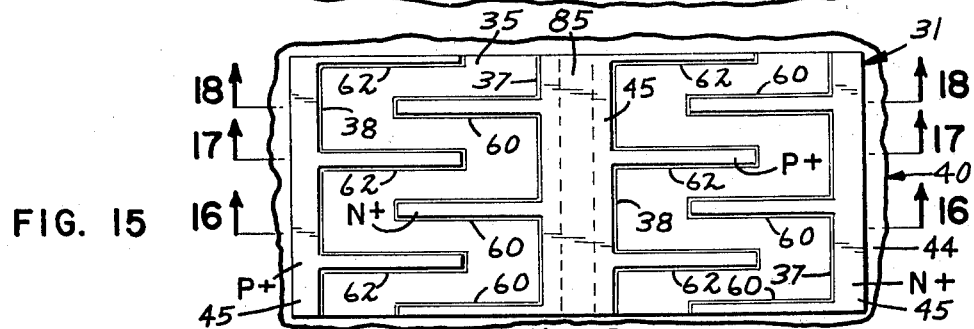
FIG. 15
FIG. 16
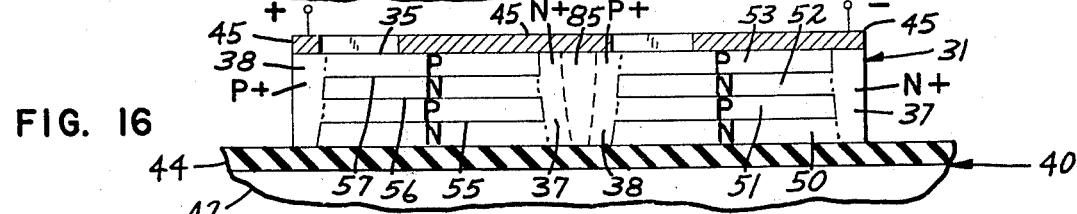
FIG. 17
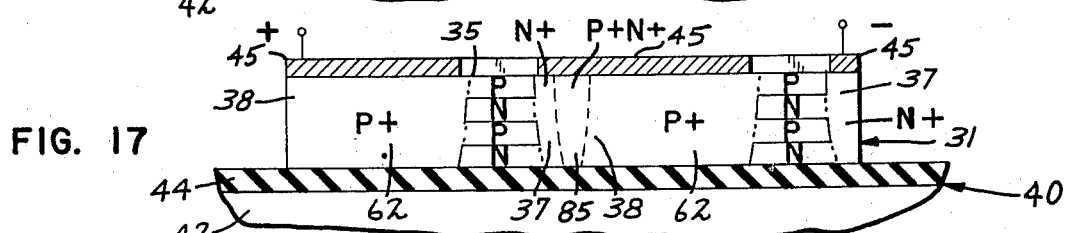
FIG. 18
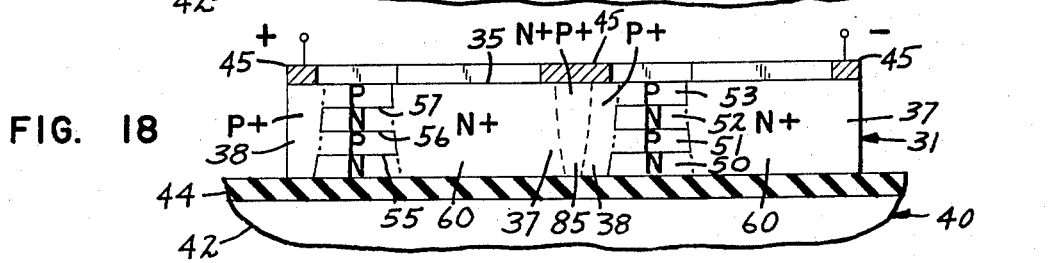

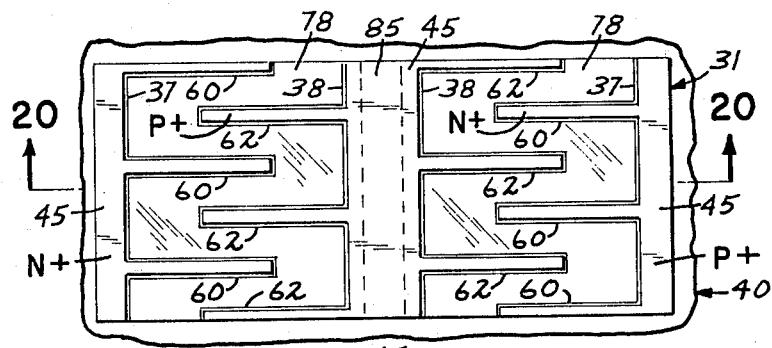
FIG. 19
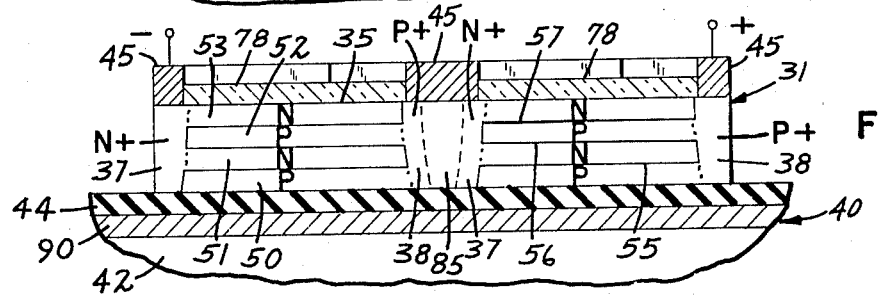
FIG. 20
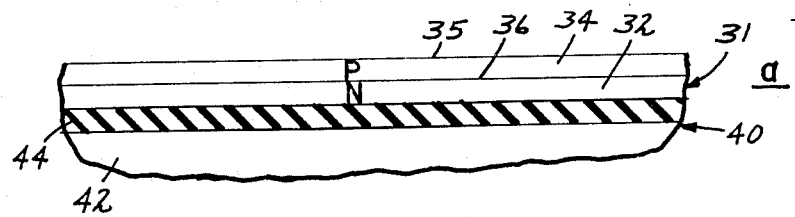
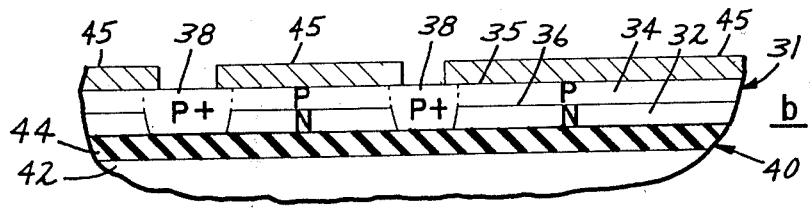
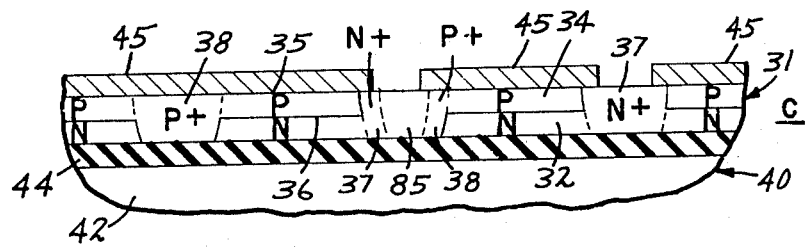
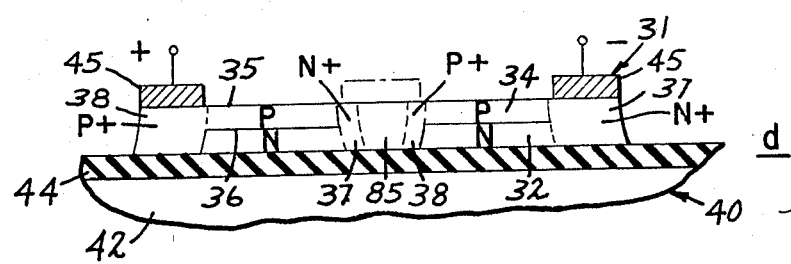
FIG. 21

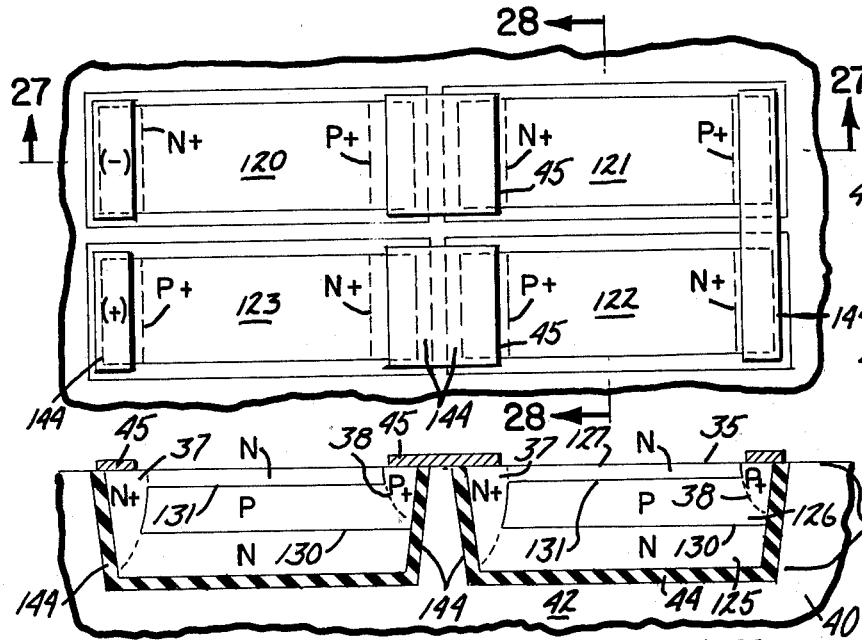
FIG. 26
FIG. 27
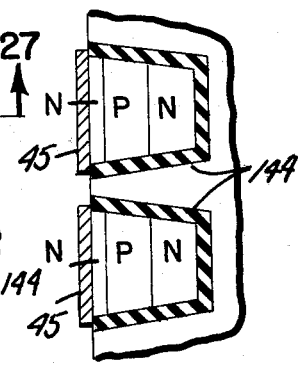
FIG. 28
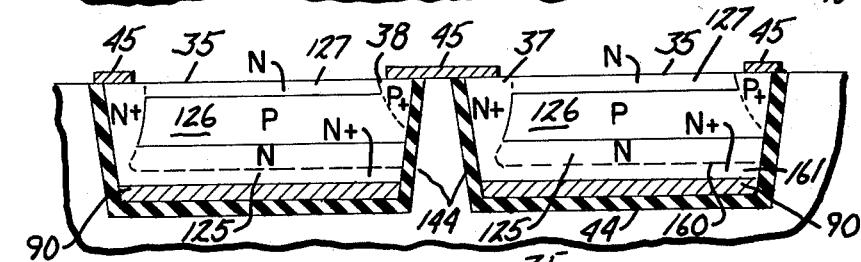
FIG. 31
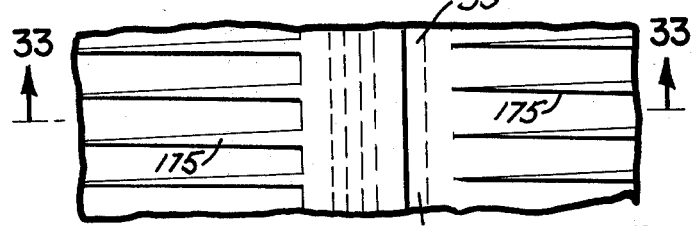
FIG. 32
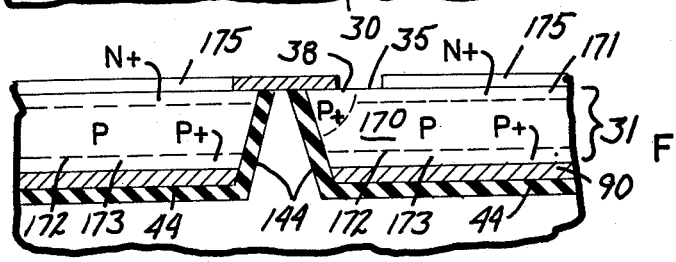
FIG. 33
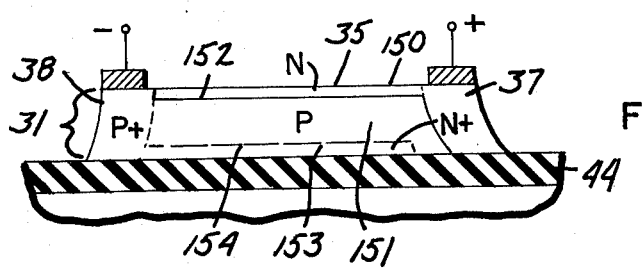
FIG. 30

PHOTOVOLTAIC SEMI-CONDUCTOR DEVICES

CONTINUATION-IN-PART APPLICATION

The present application is a Continuation-In-Part of copending Pat. application Ser. No. 575,258, filed on May 7, 1975, by the applicant hereof.

BACKGROUND OF THE INVENTION

1. Field of the Invention

This invention relates generally to microelectronic semiconductor structures and more particularly to improved monolithic photovoltaic semiconductor devices.

2. Description of the Prior Art

Technological advances on a plurality of diverse fronts have created a need for compact, efficient and highly reliable photovoltaic sources operable over indefinite extended periods of time. While early requirements for such devices were stimulated primarily by military and space-oriented programs, more recent commercialization of microelectronic batch fabrication technology has had a significant impact in all areas of commercial electronics, creating a demand and ready market for low-cost but efficient and reliable photovoltaic sources. A particular need has been created for such power sources in "personalized" electronic assemblies such as wrist watches, camera light sensing and shutter control applications, hand calculators and the like, for powering surgically implantable electronic devices such as heart and nerve stimulators, where it is undesirable to have to periodically surgically replace spent batteries of conventional design, and for a number of improvements in electromechanical instrumentation. on a larger scale, the low efficiencies inherent in the indirect processes for converting mechanical or chemical to electrical energy, coupled with decreasing supplies of natural resources conventionally employed for power generation have stimulated research for developing practical and inexpensive means for efficiently directly tapping, on a large scale, the vast reserves of solar energy for electrical power generation.

It has been only within the last several decades, with the advent of modern microelectronic semiconductor technology, that man has succeeded in directly converting solar to electrical energy on a meaningful basis via photovoltaic semiconductor cells and batteries. One of the earliest workable semiconductor solar batteries was constructed by forming a large area photosensitive junction in a block of silicon by solidphase diffusion techniques and by providing a conductive output path for the electrical current generated thereby by simply making electrical contacts to the two opposite sides of the block. This structure provided a more efficient photovoltaic device than any previously available. Subsequently, considerable effort has been invested in studying and refining both semiconductor photovoltaic cells and batteries constructed therefrom.

A physical limitation with known silicon microelectronic photovoltaic devices for generating electric current is the fact that while the output current of an individual photovoltaic cell varies proportionately with the active photovoltaic junction area of the cell, the voltage across any given cell is relatively fixed at a low value of approximately 0.5 to 0.6 volts per cell. Therefore, to configure a photovoltaic semiconductor battery having an output voltage in a usable voltage range, it has generally been recognized that a plurality of such individual photovoltaic cells must be connected in series to produce the desired output voltage.

Historically, the development of photovoltaic semiconductor devices has primarily been directed with one of two diverse principles in mind: (1) to construct via state-of-the-art semiconductor technology a more efficient individual photovoltaic cell, or (2) to configure a manageable and reliable interconnection scheme for individual solar cells, of whatever design, into series and parallel connected arrays of such cells for forming high-voltage batteries therefrom. Relatively little has been done to structure an inexpensive high-efficiency and reliable photovoltaic cell having a simple topology whose configuraton is completely compatible with microelectronic batch fabrication processes, such that a monolithic high-voltage photovoltaic array of such cells can be formed in those same simple processing operations in which the individual photovoltaic cells themselves are produced.

The operative structure required by most of the prior art individual photovoltaic cell configuratons does not permit of such cells being interconnected in one simple processing step while still in the wafer stage of processing. Most of the prior art cells require, for maximum efficiency, that electrode contacts be made to two opposite sides of the bulk material forming the cell. Such structures do not lend themselves as readily to standard microcircuit processing interconnection techniques, but require additional low-yield handling and processing which drives the cost of such devices up. In addition, hybrid (thin/thick) film techniques are generally required to interconnect such cells into series connected arrays, further decreasing yields and increasing the expense of such devices. Those configurations which do provide one-surface electrode contacts for the cell typically do not maximize their efficiency, since such one-surface contacts are typically provided at the expense of active photovoltaic junction area of the cell. Other individual cell configurations which attempt to maximize cell efficiency, for example by orienting the active junctions of the cell for illumination at their edges, require specialized base materials or fabrication processes which are not directly compatible with those employed for the fabrication of standard digital or analog integrated circuit components. Therefore, such devices typically cannot be integrated into the same wafer material as the active components which they are to energize. Further, the specialized structure of most prior art photovoltaic cell configurations dictates that they rely upon a single pass through a single junction to generate photovoltaic current, thus not permitting the simultaneous use of a plurality of features therein for increasing the cell efficiency by such techniques as multiple-pass internal reflections of the received solar energy, by inversion layers for capturing blue light energy, and the like.

A relatively small minority of prior art photovoltaic semiconductors have been designed with the intent of configuring monolithic arrays of photovoltaic cells, while still in the wafer form through batch fabrication operations, and while attempting to maximize efficiency thereof. However, for the most part, such devices are of highly specialized construction, requiring uncommon processing steps which are generally not directly compatible with the fabrication of other monolithic active devices upon the same wafer material.

Several of the prior art arrays of photovoltaic semiconductor cells use reverse biased p-n junctions for isolating individual cells therein from one another. Junction isolation techniques work well with standard integrated circuit components, where great care is taken to keep the isolating junctions of the integrated circuit in a "dark" environment. However, such isolation junctions when used in photovoltaic semiconductor devices, which are directly exposed to the solar activating energy, actually decrease the efficiency of the array since the leakage of the isolating junctions increases when exposed to energetic electromagnetic radiation. With the use of junction isolation techniques, the integrity of the isolating junction becomes extremely important, since that junction must be called upon to withstand the entire array voltage and any leakages therein can be disastrous.

The present invention overcomes these disadvantages of the prior art semiconductor photovoltaic cells and arrays by providing a topologically simple, efficient, highly reliable and low-cost photovoltaic cell configuration fabricated by standard microelectronic batch fabrication techniques which are completely compatible with those processes for fabricating standard integrated circuit possibilities if one chooses to place the photovoltaic devices on the same piece of silicon with the other active components. One embodiment of the individual photovoltaic cell configuration of this invention employs dielectric isolation techniques, for enabling, while still in wafer form, the simultaneous fabrication, isolation, and interconnection in series of individual photovoltaic cells through the use of simple, short, batch-fabrication processing stages.

While the invention will be disclosed with respect to several embodiments thereof, illustrating preferred topological layouts and methods of fabricating the devices, it will be understood that concepts encompassed by this invention apply equally well to other topological configurations and fabrication techniques respectively. Further, while the invention will be described in connection with specified materials, it will be understood that the scope of this invention is broad enough to apply equally well to other known or unknown materials yielding the desired operational properties of the inventive photovoltaic devices. Further, while the invention will be described in connection with certain combinations of desired features, it will be understood that this invention applies with equal effect to other combinations thereof.

SUMMARY OF THE INVENTION

The present invention provides an improved apparatus and method for constructing by means of standard microelectronic batch fabrication techniques photovoltaic cells and monolithic high-voltage arrays thereof which are completely compatible with those processes for fabricating standard integrated circuit active components. The photosensitive junction or junctions of semiconductor devices built according to the principles of this invention are formed within a thin layer of single-crystalline semiconductor material overlying a relatively thick supportive substrate body. The thin layer of single-crystalline semiconductor material has at least one broad surface suitable for receiving energetic electromagnetic radiation, and at least one pair of sublayers of alternating first and second conductivity types forming at their intersection a p-n junction in a plane essentially parallel to the upper irradiated surface and substantially underlying the entire area thereof.

In a first embodiment of the invention, a relatively thin layer of dielectric insulating material such as silicon dioxide underlies the upper thin layer of single-crystalline material. The dielectric insulating layer is in turn supported by a relatively thick layer of non-monocrystalline semiconductor material. In a second embodiment of the invention, the supportive substrate comprises a relatively thick layer of transparent single-crystalline insulating material such as sapphire or magnesium aluminum spinel. In a third embodiment of the invention, the supportive substrate comprises a relatively thick layer of single-crystalline material, the uppermost region of which defines the lowermost sublayer of the thin layer of singlecrystalline semiconductor material.

A pair of spaced elongate zones of heavily doped first and second conductivity types extending from the irradiated upper surface and into conductive engagement respectively with those sublayers of like conductivity type, provide low-impedance current paths for majority carriers from the respective contacted sublayers and comprise the electrodes for a photovoltaic cell.

A plurality of features may routinely be incorporated into the fundamental structures of the photovoltaic cell for increasing the cell's efficiency. These features include, but are not limited to: inversion layer means at the upper irradiated surface of the thin layer of single-crystalline semiconductor material for producing photocurrent at the irradiated surface when exposed to blue light energy; a plurality of narrow projections extending from one or both of the elongate electrode zones toward the opposing electrode in interdigitated comb-like manner for decreasing the equivalent series resistance of the cell; a plurality of sub-layers within the thin single-crysalline semiconductor layer alternating by first and second conductivity types to form a plurality of photosensitive p-n junctions within the thin layer of single-crystalline semiconductor material, which junctions are essentially parallel to the upper irradiated surface; a high-low junction (to be hereinafter described) underlying the lowermost photosentive p-n junction withiň the thin single crystalline semiconductor layer for providing an electric field for urging minority carriers toward the overlying photosensitive p-n junction(s) and for enhancing lateral conductivity; for the first embodiment structure characterized by a non-monocrystalline substrate with a thin overlying dielectric layer--a reflective medium disposed either between the dielectric layer and the underlying non-monocrystalline substrate material or between the dielectric layer and the overlying thin single-crystalline semiconductor for reflecting energetic electromagnetic radiation back into the thin single-crystalline semiconductor material; and for the second embodiment structure characterized by a transparent single-crystalline substrate material—reflective media within the substrate material or at the lower surface thereof for reflecting energetic electromagnetic radiation back into the overlying thin layer of single-crystalline semiconductor material.

Means for providing a multiple-pass environment may be included in cooperation with any of the reflective layer features for causing total internal reflection of energetic electromagnetic radiation passing into the photovoltaic device through the upper irradiated surface.

Monolithic high-voltage photovoltaic cell arrays are fabricated by using the same processing steps employed to structure single photovoltaic cells, wherein those embodiments of the invention which use insulating substrate and dielectric layer materials are employed. Electrical isolation of individual cells within the arrays may be achieved either by means of appropriately disposed standard diffusions or by means of shaped dielectric barriers or moats.

For those monolithic photovoltaic array embodiments which achieve inter-cell isolation by means of diffusion techniques, a plurality of first and second heavily doped conductivity type elongate zones, aligned generally parallel to one another and successively alternating between those of the first and the second conductivity types are oriented intermediate and generally parallel to the electrode zones and extend continuously from the irradiated upper surface into conductive engagement with those respective sublayers within the thin single-crystalline semiconductor material having a like conductivity type. The "intermediate" elongate zones are disposed in closely adjacent pairs of opposite conductivity types and extend entirely across the thin layer of semiconductor material which is to define the photovoltaic cells. That one of the intermediate elongate zones of each closely adjacent pair which has a conductivity type opposite to the lowermost sublayer of the thin layer of semiconductor material, extends entirely through the thin layer and into engagement with the underlying insulating substrate or dielectric layer. Since the heavily doped conductivity zones comprising the widely spaced and the intermediate zones, and which are of the same conductivity type, can be simultaneously diffused, no additional processing steps need be required to fabricate the photovoltaic arrays than are required to fabricate individual photovoltaic cells.

Each portion of the thin layer of single-crystalline semiconductor material that is disposed between successive widely spaced pairs of the closely adjacent zones forms a single photovoltaic cell of the array with the closely adjacent pairs of elongate zones, in combination with the underlying insulating layer cooperatively providing isolation between adjacent cells. The closely adjacent intermediate elongate zones can be oriented to just touch one another or can be spaced slightly apart from one another, in which cases an overlying metallization strip provides series connection between the adjacent cells. Alternatively, the closely adjacent elongate zones can be disposed to substantially overlap one another along their lengths, simultaneously providing with said underlying insulating layer, isolation of adjacent cells while establishing electrical series connection thereof.

Formation of dielectrically isolated monolithic photovoltaic arrays can also be achieved within the scope of this invention by electrically isolating adjacent cells directly by means of shaped dielectric barriers or moats. Dielectric insulating barriers are fabricated by means of standard monolithic batch fabrication techniques so as to continuously project upwardly from the underlying insulating substrate and entirely through the thin upper layer of single-crystalline semiconductor material, to electrically isolate those portions of the thin upper layer which lie on oppositely disposed sides respectively thereof. The dielectric barriers may be oriented so as to completely surround, in moat-like manner, individual photovoltaic cells, or may be disposed to laterally extend entirely across the thin layer of single-crystalline semiconductor material to longitudinally subdivide adjacent portions thereof into a plurality of photovoltaic cells that are electrically isolated from one another. The spaced zones of heavily doped first and second conductivity types are diffused through the upper irradiated surface and into the thin single-crystalline semiconductor material, as previously described, forming electrodes of the isolated cells. The electrode diffusions of adjacent cells of the array can be disposed closely adjacent one another on opposite sides of the cell separating dielectric barriers. The electrodes of adjacent cells can be interconnected by metallization patterns formed by means of standard monolithic batch fabrication techniques on the upper irradiated surface of the array, so as to selectively bridge the dielectric barriers for electrically connecting the isolated cells in series or parallel as desired.

Those efficiency-improving features previously described with respect to the fabrication of individual cells may readily be incorporated into the batch fabrication construction of photovoltaic arrays constructed according to the principles of this invention, regardless of the specific inter-cell isolation technique used.

BRIEF DESCRIPTION OF THE DRAWING

Referring to the Drawing, where like numerals represent like parts throughout the several views:

FIG. 1 is a diagrammatic illustration, in top plan, of one embodiment of a simple single photovoltaic cell constructed according to the principles of this invention and employing a dielectrically insulating substrate;

FIGS. 2 and 2A are diagrammatic illustrations, in cross section, of the photovoltaic cell disclosed in FIG. 1, generally viewed along Line 2—2 in FIG. 1;

FIG. 3 is a diagrammatic illustration, in cross section, of a photovoltaic cell having a top plan view as illustrated in FIG. 1, as generally viewed along the Line 2—2 thereof, and generally constructed according to the principles of this invention with an underlying reflective layer;

FIG. 4 is a diagrammatic illustration, in top plan, of a second embodiment of a single photovoltaic cell constructed according to the principles of this invention, including interdigitated electrodes and a multiplicity of photovoltaic junctions;

FIG. 5 is a diagrammatic illustration, in cross section of the photovoltaic cell disclosed in FIG. 4, generally as viewed along the Line 5—5 of FIG. 4;

FIG. 6 is a diagrammtic illustration, in cross section of the photovoltaic cell disclosed in FIG. 4 generally as viewed along the Line 6—6 of FIG. 4;

FIG. 7 is a diagrammatic illustration in cross section of the photovoltaic cell disclosed in FIG. 4, generally as viewed along the Line 7—7 of FIG. 4;

FIG. 13 is a diagrammatic illustration, in top plan, of one embodiment of a monolithic high-voltage photovoltaic cell array configured according to the principles of this invention;

FIG. 14 is a diagrammatic illustration, in cross section, of the monolithic photovoltaic cell array disclosed in FIG. 13, generally viewed along the Line 14—14 of FIG. 13;

FIG. 15 is a diagrammatic illustration, in top plan, of a second embodiment of a monolithic photovoltaic cell array constructed according to the principles of this invention including interdigitated electrodes and a multiplicity of photovoltaic junctions in each cell;

FIG. 16 is a diagrammatic illustration, in cross section, of the monolithic photovoltaic cell array disclosed in FIG. 15, generaly viewed along the Line 16—16 of FIG. 15;

FIG. 17 is a diagrammatic illustration in cross section, of the monolithic photovoltaic cell array disclosed in FIG. 15, generally viewed along the Line 18—18 of FIG. 15;

FIG. 18 is a diagrammatic illustration in cross section of the monolithic photovoltaic cell array disclosed in FIG. 15, generally viewed along the Line 18—18 of FIG. 15;

FIG. 19 is a diagrammatic illustration, in top plan, of a two-cell monolithic photovoltaic cell array, constructed according to the principles of this invention, including interdigitated cell electrodes, multiple photovoltaic junctions, a reflective sublayer, an upper inversion layer, and an insulating supportive substrate;

FIG. 20 is a diagrammatic illustration in cross section, of the photovoltaic cell array disclosed in FIG. 19, generally viewed along the Line 20—20 in FIG. 19;

FIGS. 21($a$) through 21($d$) are diagrammatic illustrations of sequential processing steps for practising one method of constructing a monolithic high-voltage photovoltaic cell array according to the principles of this invention;

FIG. 26 is a diagrammatic illustration, in top plan, of a four-cell, series-connected monolithic photovoltaic cell array, constructed according to the principles of this invention and displaying the use of dielectric barrier techniques for electrically isolating adjacent cells from one another;

FIG. 27 is a diagrammtic illustration, in cross section, of the photovoltaic cell array disclosed in FIG. 26, generally viewed along the Line 27—27 of FIG. 26;

FIG. 28 is a diagrammatic illustration, in cross section, of the photovoltaic cell array disclosed in FIG. 26, generally viewed along the Line 28—28 in FIG. 26;

FIG. 30 is a diagrammatic illustration in cross section of a photovoltaic cell of the basis structure disclosed in FIG. 1, as generally viewed along the Line 2—2 of FIG. 1, illustrating the application of the high-low junction feature of this invention with the basic photovoltaic cell;

FIG. 31 is a diagrammatic illustration in cross section of a photovoltaic cell array of the basic structure disclosed in FIG. 26, as generally viewed along the Line 27—27 with portions thereof broken away, illustrating the overlying reflective layer and the high-low junction features of this invention as applied with a dielectric barrier cell-isolating array structure;

FIG. 32 is a diagrammtic illustration in top plan of a two-cell photovoltaic array, with portions thereof broken away, illustrating use of the dielectric barrier isolation technique with a simplified single photovoltaic junction structure; and FIG. 33 is a diagrammatic illustration in cross section of the photovoltaic cell array disclosed in FIG. 32, as generally viewed along the Line 33—3 of FIG. 32, illustrating the overlying reflective layer and the high-low junction features of this invention as employed with the simplified single photovoltaic junction structure.

DESCRIPTION OF THE PREFERRED EMBODIMENTS

Figure 8:
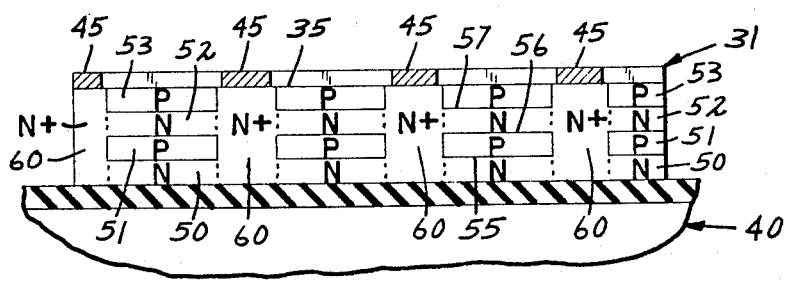
FIG. 8 is an enlarged diagrammatic illustration, in cross section of the photovoltaic cell disclosed in FIG. 4, generally as viewed along the Line 8—8 of FIG. 4.
Figure 9:
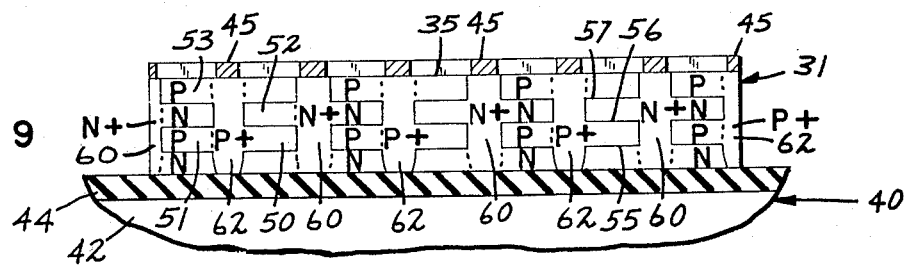
FIG. 9 is an enlarged diagrammatic illustration, in cross section of the photovoltiac cell disclosed in FIG. 4, generally as viewed along the Line 9—9 of FIG. 4.
Figure 10:
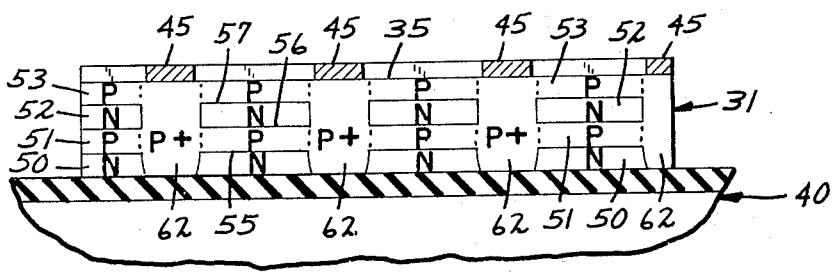
FIG. 10 is an enlarged diagrammatic illustration, in cross section of the photovoltiac cell disclosed in FIG. 4, generally as viewed along the Line 10—10 of FIG. 4.

Referring to the Drawing, the basic configuration for a photovoltaic cell constructed according to the principles of this invention is diagrammatically illustrated at 30 in FIGS. 1 and 2. Referring thereto, a thin layer of single-crystalline semiconductor material, generally designated as 31, is mounted upon a relatively thick supportive substrate, generally designated as 40. In the preferred embodiment, disclosed in FIGS. 1 and 2, the supportive substrate comprises a relatively thick lower layer of nonmonocrystalline material 42 having an upper layer of dielectrically insulating material 44 such as silicon dioxide. In the embodiment illustrated, the lower substrate material 42 comprises polycrystalline silicon, however, other vitreous or amorphous non-monocrystalline materials such as silicon dioxide could also be employed to yield the illustrated supportive substrate configuration.

The thin layer of single-crystalline semiconductor material 31, has a pair of ($n$) and ($p$) conductivity type sublayers 32 and 34 respectively extending entirely across the thin single-crystalline semiconductor layer 31 and forming an active $p$-$n$ junction 36 at their intersection. The upper surface 35 of the thin layer 31 is disposed for receiving energetic electromagnetic radiation therethrough into the thin layer 31. The $p$-$n$ junction 36 lies in a plane essentially parallel to the irradiated upper surface 35.

In the preferred embodiment, the thickness of the substrate 40 may typically range from 100 to 500 micrometers. The combined thickness of the individual sublayers 32 and 34 of the upper layer 31 would ordinarily be too thin to be self-supportive without the underlying substrate material 40. In the preferred embodiment, the thickness of the individual sublayers 32 and 34 of the upper layer 31 will typically range from 1 to 50 micrometers each, but their thickness range could be expanded within the scope of this invention from 0.1 to 100 micrometers each. In the preferred embodiment, the thin layer of monocrystalline semiconductor material is formed by lap-polish methods well known in the art (see Integrated Circuits; Design Principles and Fabrication, McGraw Hill, 1965, at pp.166–173, edited by the inventor hereof) or by self-terminating etching techniques. The resistivity value of the thin layer of monocrystalline semiconductor material will preferably range from 0.01 to 10 ohm-centimeters, but could range within the scope of this invention from 0.0001 to 100 ohm-centimeters. Lap-polish methods will be hereinafter defined in more detail. The doping levels and concentrations throughout the layers of semiconductor material can be optimized by means of epitaxial growth methods, whereby both uniform and graded junction doping levels can be controllably achieved for the sublayers 32 and 34. The $p$-$n$ junction 36 could also be formed, however, by means of standard diffusion techniques.

For that single cell illustrated in FIGS. 1 and 2, the electrodes comprise first and second zones 37 and 38 respectively of heavily doped ($n+$) and ($p+$) conductivity impurities. Each of the heavily doped zones 37 and 38 respectively extends essentially across the thin layer 31 near opposite ends thereof with the heavily doped ($n+$) type zone 37 extending from the upper irradiated surface 35 into conductive engagement with the ($n$) type sublayer 32, providing a low-impedance current path for majority carriers from the ($n$) type sublayer 32 to the upper irradiated surface 35. The heavily doped ($p+$) type elongate zone 38 continuously extends from the upper irradiated surface 35 into conductive engagement with the ($p$) type sublayer 34, providing a low-impedance current path for majority carriers from the ($p$) type sublayer 34 to the upper irradiated surface 35. The ($p$) and ($n$) type elongate zones 37 and 38 respectively, form the anode and cathode terminals respectively for the photovoltaic cell 30.

The elongate zones 37 and 38 are illustrated as extending entirely down into engagement with the underlying insulating dielectric material 44; however, as will be hereinafter discussed in more detail, the respective electrode zones need only extend into the thin layer 31 to a depth sufficient to permit conductive engagement with those sublayers having a like conductivity type. In the preferred embodiment, as hereinafter described, the heavily doped elongate zones 37 and 38 are formed by standard diffusion processes by diffusing impurities through masked regions on the upper surface 35 into the thin layer 31. The invention, however, is not limited to the use of diffusion methods for forming the elongate zones.

The physical widths of the elongate heavily doped zones 37 and 38 are very small in comparison with the relative spacing therebetween, to minimize loss of active $p$-$n$ junction 36 area. It will be understood that the Figures illustrated in the Drawing are diagrammtical only, and are not intended to portray scaled representations of relative portions of the invention. Accordingly, the widths of the elongate zones 37 and 38 are significantly magnified in the Figures, and are out of proportion relative to their actual interzone spacing and relative to other dimensions of the photovoltaic cell.

An optional metallization layer 45 substantially overlies the elongate zones 37 and 38, providing a low-current conductive path therefrom for connection to external circuits.

An alternate technique for supporting the thin layer of monocrystalline semiconductor material 31 is illustrated in FIG. 2A. Referring thereto, the supportive substrate 40 comprises a single thick layer of insulating material 40' such as sapphire or magnesium aluminum spinel, both being single-crystalline transparent insulating materials. When such single-crystalline insulator materials are employed as the supportive substrate 40', the thin layer of single-crystalline semiconductor material 31 is grown directly thereon. Since the quality of silicon within the thin single-crystalline layer 31 when grown upon such insulating substrate material as sapphire is somewhat inferior to the quality of silicon (such as 31 in FIG. 2) produced by the methods cited on page 20, the supportive substrate structure illustrated in FIG. 2A is not completely compatible with integrated circuit bipolar transistors, but the substrate structure illustrated in FIG. 2 is completely compatible with standard integrated circuit bipolar logic families such as integrated injection logic ($I^2L$) and the like. This means that the full range of integrated circuit possibilities exists if one chooses to place the photovoltaic and active integrated circuit components on the same piece of silicon. However, use of the transparent insulating substrate materials is clearly within the scope of this invention. Hereinafter it will be understood that while the Figures of the Drawing will be primarily described with reference to the preferred insulating substrate configuration, the alternate insulating substrate configuration 40' could equally well be employed within the spirit and intent of this invention.

A second embodiment of a single photovoltaic cell constructed according to the principles of this invention is illustrated in various views in FIGS. 4 through 10. Referring thereto, it will be noted that the thin layer of single-crystalline semiconductor material 31 overlying the supportive substrate 40 is subdivided into a plurality of alternating sublayers of ($p$) and ($n$) conductivity types 50 through 53 defining a plurality of $p$-$n$ junctions 55, 56 and 57 at their respective intersections, with the active $p$-$n$ junctions 55 through 57 lying in planes essentially parallel to one another and to the upper irradiated surface 35 of the thin layer 31. While the thin layer of single-crystalline semiconductor material 31 illustrated in FIGS. 4 through 10 is subdivided into four sublayers (50–53) defining three active $p$-$n$ junctions (55–57), it will be understood that any number of such sublayers could be employed to define a corresponding number, less one, of active $p$-$n$ junctions. Further, the particular order of the ($n$) and ($p$) sublayers within the thin layer 31 is not material for describing this invention, as long as the sublayers alternate between opposite conductivity types.

The elongate heavily doped ($n+$) zone 37 (FIGS. 4–7) continuously extends vertically downward continuously from the upper irradiated surface 35 into conductive engagement with each of the ($n$) type sublayers 50 and 52, providing a low-impedance current path for majority carriers therefrom to the upper irradiated surface 35. The elongate heavily doped (p+) zone 38 continuously extends vertically downward from the upper irradiated surface 35 into conductive engagement with each of the (p) type sublayers 51 and 53, providing a low-impedance current path for majority carriers therefrom to the upper irradiated surface 35.

The heavily doped (n+) elongate zone 37 has a plurality of narrow extensions 60 projecting in comb-like manner outwardly from the longitudinal direction of the main body of the zone 37 in the direction toward the (p+) elongate zone 38. In the preferred embodiment, extensions 60 of the (n+) elongate zone 37 are diffused into the thin layer of single-crystalline semiconductor material 31 at the same time that the main body of the elongate (n+) zone 37 is formed, and extend into conductive engagement with each of the (n) type sublayers (50 and 52 in FIGS. 9–10).

The heavily doped (p+) elongate zone 38 has a plurality of narrow extensions 62 projecting in comb-like manner outwardly from the longitudinal direction of the main body of the zone 38 in the direction toward the (n+) elongate zone 37. The comb-like extensions 62 of the (p+) elongate zone 38 extend relative to the upper irradiated surface 35 of the thin layer 31 in interdigitated manner with the plurality of comb-like extensions 60 of the (n+) elongate zone 37. In the preferred embodiment the plurality of (p+) type extensions 62 are diffused into the thin layer 31 at the same time that the main body of the (p+) zone 38 is formed, and extend continuously from the upper irradiated surface 35 into conductive engagement with each of the (p) type sublayers (53 and 51 in FIGS. 4–10).

The plurality of comb-like extensions 60 and 62 respectively of the (n+) and (p+) elongate zones 37 and 38 respectively provide additional low-impedance current paths for majority carriers from the plurality of (n) type and (p) type sublayers 50–53 respectively, significantly decreasing the parasitic series resistance of the photovoltaic cells. In the preferred embodiment the comb-like extensions 60 and 62 are formed by masked diffusion processes enabling very narrow geometries thereof so as to minimize their subtractive effect from the area of active p-n junctions which are exposed to incident energetic electromagnetic radiation. The metallization layers 45 overlying the main body portions of the heavily doped (n+) and (p+) elongate zones 37 and 38 respectively also extend in overlying conductive engagement with their respective plurality of comb-like extensions 60 and 62.

Using a plurality of alternating (p) and (n) type sublayers withing the thin single-crystalline semiconductor layer 31 provides an increase in active junction area for collecting generated photovoltaic carriers, for any photovoltaic cell whose upper irradiated surface area 35 is fixed, thus increasing the efficiency of the photovoltaic cell. Further the interdigitated comb-like extensions projecting substantially across the photovoltaic cell maintain that high efficiency of the cell developed by the multiple active junctions by providing readily accessible low-impedance current-flow paths for the generated majority carriers, to their respective electrodes.

Figure 11:
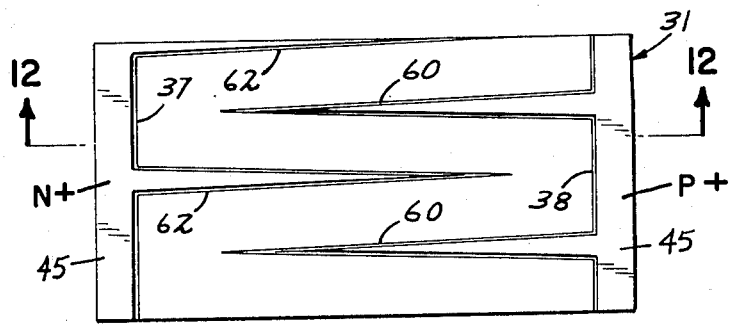
FIG. 11 is a diagrammatic illustration, in top plan, of a third embodiment of a photovoltaic cell constructed according to the principles of this invention, having a single-crystalline non-insulating supportive substrate.
Figure 12:
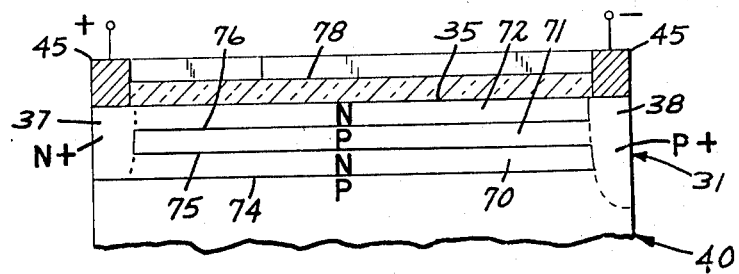
FIG. 12 is a diagrammatic illustration, in cross section of the photovoltaic cell disclosed in FIG. 11, generally viewed along the Line 12—12 of FIG. 11.

A third embodiment of a single photovoltaic cell constructed according to the principles of this ivention is illustrated in FIGS. 11 and 12. Referring thereto, the thin layer of single-crystalline semiconductor material 31 comprises a plurality of sublayers of alternating (n) and (p) conductivity types 70–72, supported by a relatively thick substrate layer of single-crystalline semiconductor (p) type material. The intersections of the (p) type supportive substrate material with the lowermost (n) type sublayer 70, and of the respective sublayers 70 through 72 with one another form a plurality of active p-n junctions 74 through 76 respectively in planes that are essentially parallel to one another and to the upper irradiated surface 35 of the thin region 31. This embodiment does not include an insulating substrate material, and does not readily lend itself to the formation of monolithic high-voltage solar cell arrays, but does employ the thin single-crystalline semiconductor layer principles of this invention in a multi-layer configuration to provide a highly efficient photovoltaic cell. Each of the elongate heavily doped (p+) and (n+) elongate zones 37 and 38 respectively also has the plurality of extensions 60 and 62 respectively projecting in narrow comb-like interdigitated manner across the thin layer of single-crystalline semiconductor material 31 for decreasing the parasitic equivalent series resistance of the photovoltaic cell.

The solar cell illustrated in the third embodiment of this invention further has a doped oxide layer 78 overlying the upper irradiated surface 35 of the thin layer 31 to create an inversion layer at the upper irradiated surface 35, for capturing carriers generated thereat by the non-penetrating high energy (blue light) components of the energetic electromagnetic spectrum. Use of the inversion layer 78 at the upper irradiated surface 35 significantly, increases the efficiency of the photovoltaic cell by capturing the blue light energy which would otherwise not penetrate into the underlying sublayers within the thin layer 31. While a doped oxide layer is disclosed for generating the inversion layer, it will be understood that other methods of producing an inversion layer at the irradiated surface 35 could equally well be employed within the spirit and intent of this invention. The combined effects of the multiple active junctions, the interdigitated narrow comb-like electrodes, and the inversion layer generating means collectively provide an efficient photovoltaic cell constructed almost entirely of single-crystalline semiconductor materials.

Use of an insulating substrate 40 (of whatever configuration) for forming the basic photovoltaic cell is highly advantageous from cost, efficiency and design flexibility standpoints when forming monolithic high-voltage arays of such cells. A three-cell series-connected array of photovoltaic cells 80 constructed according to the principles of this invention is illustrated in FIGS. 13 and 14. Referring thereto, the thin layer of single-crystalline semiconductor material 31 is illustrated as mounted upon the preferred substrate configuration 40 having the dielectrically insulating layer 44 overlying the relatively thick non-monocrystalline substrate body 42. Three series-connected photovoltaic cells each having the general properties and configuration of the single cell previously described relative to FIG. 2, are respectively illustrated at 81, 82, and 83. The thin layer of single-crystalline semiconductor material 31 of each cell has a plurality of sublayers 32 and 34 in (FIGS. 13 and 14) forming a p–n junction 36 at their intersection in a plane lying essentially parallel to the upper irradiated surface 35, as previously described. Further, as previously described, each of the cells has a pair of elongate heavily doped (n+) and (p+) electrode zones 37 and 38 respectively with the (n+) type elongate electrode zone of cell 83 comprising the negative terminal of the series connected array 80 and with the (p+) type elongate electrode zone of the photovoltaic cell 81 comprising the positive terminal of the series-connected array 80.

The elongate (n+) and (p+) type zones are disposed generally parallel to one another and extend entirely across the thin layer 31 in one lateral direction thereof (see FIG. 13). The intermediate adjacent ones of the elongate (n+) and (p+) type zones 37 and 38 respectively partially overlap one another at 85 (FIG. 14), forming elongate zones 85 heavily doped with both (n+) and (P+) conductivity types lying between adjacent ones of the individual photovoltaic cells.

As will become apparent upon a more detailed description herein, the overlapping elongate zones of (n+) and (p+) conductivity types 37 and 38 respectively, in combination with the underlying insulating layer 44, simultaneously electrically isolate adjacent ones of the photovoltaic cells from one another while electrically connecting the adjacent cells in series with one another.

While each of the intermediate overlapping (n+) and (p+) elongate zones 37 and 38 respectively is illustrated in FIG. 14 as extending entirely to the underlying insulating layer 44, it is not necessary for the elongate zones of both conductivity types to extend entirely into engagement with the insulating sublayer 44 to provide electrical isolation of the adjacent cells. To electrically isolate adjacent ones of the photovoltaic cells from one another, it is necessary only that that intermediate elongate zone having a conductivity type opposite to the conductivity type of the lowermost sublayer (32 in FIG. 14) of the thin layer of single-crystalline semiconductor material 31, extend from the upper irradiated surface 35 entirely through the thin layer 31 and into engagement with the insulating material 44.

Referring to FIGS. 13 and 14, metallization layers 45 overlie the outermost (n+) and (p+) elongate zones of the array 80, providing conductive paths from these cathode and anode electrodes respectively of the array. As illustrated in FIGS. 13 and 14, stripes of metallization may optionally be placed to overlie the overlapping (n+) and (p+) type elongate zones; however, if the doping concentration levels of the overlapping (n+) and (p+) type elongate zones is sufficiently high, the overlying metallization stripes over these areas is not required to electrically connect adjacent ones of the photovoltaic cells in series. For optimum efficiency, however, a metallization stripe overlying the overlapping elongate (n+) and (p+) type zones, provides a short-circuit conductive path between the heavily doped surfaces of these zones and simultaneously masks energetic electromagnetic radiation from irradiating the junctions formed by the intersection of the overlapping zones, minimizing any bucking voltages produced thereby.

The above described series-connected array of dielectrically isolated photovoltaic cells may be rapidly, simply and efficiently produced by a minimum of high-yield processing steps. The preferred method will be described with reference to FIG. 21. Note that the common numbering system is being carried over from prior descriptions. Referring to FIG. 21, for the most basic single-junction case, a $p-n$ junction is formed in a thin layer of single-crystalline semiconductor material overlying an insulating supportive substrate. As previously described, the insulating substrate comprises a thin layer of dielectric isolating material 44 overlying a relatively thick supporting non-monocrystalline substrate material 42. In the preferred embodiment, the $p-n$ junction 36 is formed by means of epitaxial growth methods, however, other methods of forming the $p-n$ junction 36 could be employed, including diffusion methods. That well-known method typically used for forming the $p-n$ junction 36 by epitaxial growth methods comprises the following basic steps: an $(n)$ type layer 32 is epitaxially grown on one surface of a uniformly doped slice of $(p)$ type 34 material; a silicon dioxide layer 44 is grown or deposited upon the $(n)$ type layer; a relatively thick layer of polycrystalline silicon 42 is deposited on the silicon dioxide layer 44; the upper surface of the starting $(p)$ type material is lapped and polished, leaving a relatively thin layer thereof having an upper surface 35, with the $(p)$ and $(n)$ conductivity type single-crystalline materials comprising the thin layer 31 and forming a $p-n$ junction 36 in the thin layer 31—all illustrated in FIG. 21a. Although the Figures of the Drawing generally illustrate a $(p)$ type layer exposed to light, it should be noted that no particular significance is placed upon the starting order of the conductivity type sublayers within the thin layer 31, and in many applications it is more desirable to have an $(n)$ type layer exposed to the light. The sublayers should alternate however, between opposite conductivity types in the direction normal to the upper irradiated surface 35.

Continuing with the process description, referring to FIG. 21b, the upper surface 35 of the thin layer of single-crystalline semiconductor material 31 is masked via standard masking techniques and a plurality of generally parallel, widely spaced elongate heavily doped (p+) type zones 38 are diffused from the upper irradiated surface into conductive engagement with each of the underlying (p) type sublayers. In that embodiment illustrated in FIG. 21b, since the lowermost sublayer within the thin layer 31 of single-crystalline semiconductor material is of an (n) type conductivity, the elongate zones of (p+) type conductivity would be diffused entirely through the thin layer 31 into engagement with the underlying insulating layer 44.

Following the (p+) type diffusion, the single-crystalline layer 31 is remasked and a plurality of elongate heavily doped (n+) type zones 37 are diffused from the upper irradiated surface 35 into conductive engagement with each of the underlying (n) type sublayers within the thin layer 31. The (n+) type diffusion masking is configured such that a plurality of successive ones of the (n+) type elongate zones lie closely adjacent to or partially overlap the elongate (p+) type diffused zones. The (n+) diffusions illustrated in FIG. 21c partially overlap the (p+) diffusions and extend entirely down to the insulating sublayer 44. For facilitating the process, the same mask may be used for both the (p+) and the (n+) elongate zone diffusions by rotating it through 180° and then shifting the mask in one direction along the upper irradiated surface 35 for the respective opposite conductivity type diffusions. For that configuration illustrated in FIG. 21c, the (n+) elongate zone diffusions need not extend entirely down to the insulating layer 44, but need only extend into conductive engagement with the lowermost (n) type sublayer. Adjacent widely spaced ones of the (n+) and (p+) type elongate zone diffusions define individual photovoltaic cells of the configuration illustrated in FIG. 2. The closely adjacent or overlapping (p+) and (n+) elongate zones, in combination with the underlying dielectric insulating layer 44, simultaneously electrically isolate adjacent ones of the photovoltaic cells from one another and connect in electrical series the adjacent cells to one another.

Arrays of such series-connected photovoltaic cells are next defind by a mesa-etch process, well known in the art, along or near those elongated (n+) and (p+) type zones which are to define the cathode and anode terminals respectively of the array and along the ends of the intermediate zones (see FIG. 21d).

The final processing step (see FIG. 21d ) is to form metallization layers overlying the outermost (n+) and (p+) type elongate diffusion zones, forming the cathode and anode terminals respectively and providing electrical conductive paths to external circuits. A strip of metallization may also be placed in overlying engagement with the closely adjacent or overlapping elongate diffusions to provide a conductive short-circuit between the heavily doped surface of one conductivity type zone through the overlying metal into the heavily doped surface of the opposite conductivity type zone. Therefore, a monolithic high-voltage array of dielectrically isolated, series-connected photovoltaic cells can be simply formed by two short diffusion processes, providing a simple topological pattern providing high reliability and higher yields due to batch fabrication processes requiring a minimum of handling steps, thus reducing the overall cost of the device. Methods of fabricating photovoltaic cells using dielectric isolation principles, are very "fault-tolerant." Imperfections in the thin single-crystalline semiconductor layer of material wich could cause "pipes" between layers or which could extend down to the underlying insulating layer have no substantial effect on the overall operation of the photovoltaic cells or array since their presence does not affect the isolation of individual cells from one another. Also, pinholes in the diffusion-masking oxide do not cause a faulty cell, but merely a trivial loss of active area. Further, should the metallization patterns overlying the anode and cathode elongate diffusions, through misalignment or the like, extend over the edges of the electrode diffusions into contact with the underlying insulating layer 44, no harm results due to the presence of the dielectrically isolating layer.

It will be understood that the scope of this invention encompasses any number of alternate techniques for forming monolithic photovoltaic cell arrays through the use of dielectric isolation principles. One such technique achieving inter-cell isolation directly by means of shaped dielectrical barriers continuously extending from an underlying dielectric layer, is illustrated in FIGS. 26 through 28.

Referring thereto, a four-cell series-connected photovoltaic cell array is illustrated. The thin upper layer of single-crystalline semiconductor material 31 is illustrated as overlying the relatively thick supportive substrate 40 which is, in the preferred embodiment, a non-monocyrstalline material. The dielectrically insulating layer 44 is interposed between the supporting substrate body 42 and the thin upper layer 31 as previously described and has a plurality of projections or barriers 144 extending upwardly from the general plane of the dielectric layer 44 to the upper irradiated surface 35, thus passing entirely through the thin layer of single-crystalline semiconductor material 31. The dielectric extensions or barriers 144, therefore, electrically isolate those portions of the thin upper single-crystalline semiconductor layer 31 which lie on oppositely disposed sides respectively thereof. The dielectric barriers 144 are formed using monolithic processing steps (as hereinafter described) and thus form an integral part of the monolithic array structure.

As illustrated in FIG. 26-28, the dielectric barriers 144 may be configured so as to completely surround or to isolate, in moat-like manner, portions of the thin upper layer 31. The respectively isolated portions of the thin upper layer 31 define individual cells 120-123 of the monolithic photovoltaic array. Alternatively, the dielectric barriers could be disposed so as to laterally extend entirely across the thin layer of single-crystalline material (not illustrated) to longitudinally subdivide adjacent portions of the thin upper layer into a plurality of isolated photovoltaic cells. When isolated by moat-like forming dielectric barriers 144 as illustrated in FIGS. 26-28, the individual photovoltaic cells can be arranged in any configuration relative to one another which is compatible with the monolithic processing steps employed and which conveniently satisfies the topoligical interconnection design constraints imposed by the application requirements for the photovoltaic array.

As illustrated in FIGS. 26-28, the thin upper layer of single-crystalline semiconductor material 31 is subdivided into three sublayers of alternating (p) and (n) conductivity types 125, 126 and 127, defining two p-n junctons 130 and 131 at their respective intersections. As previously pointed out, it will be understood that the thin layer of single-crystalline material 31 canbe constructed to form any number of photovoltaic p-n junctions and that the particular order of the (p) and (n) conductivity type sublayers within the thin layer 31 can be varied as long as the respective sublayers alternate between opposite conductivity types.

As previously described with respect to the single photovoltaic cell construction, each of the photovoltaic cells has a pair of elongate spaced heavily doped (n+) and (p+) zones 37 and 38 respectively forming the negative and positive electrodes of each cell. The (n+) type electrode zone 37 continuously extend from the upper irradiated surface 35 into conductive engagement with each of the (n) type sublayers 125 and 127. The (p+) type electrode zones 38 continuously extend from the upper irradiated surface 35 into conductive engagement with the (p) type sublayer 126. It will be appreciated that when inter-cell isolation is achieved by means of dielectric barriers such as 144, the electrode zones are not involved in the intercell isolation mechanism and, therefore, need not extend entirely down to the main plane of the underlying dielectric layer 44.

The isolated photovoltaic cells are connected in electrical series or parallel, as desired, by means of metallization patterns deposited on the upper irradiated surface of the photovoltaic array according to standard integrated circuit principles. The individual cells of the photovoltaic array illustrated in FIGS. 26-28 are connected in series, with the (n+) type electrode of cell 120 and the (p+) type electrode of cell 123 forming the negative and positive terminals respectively of the monolithic phototovoltaic array. While a series-connected array has been illustrated, it will be appreciated that parallel or series/parallel connected arrays can also be readily configured using the basic principles of this invention.

Figure 29:
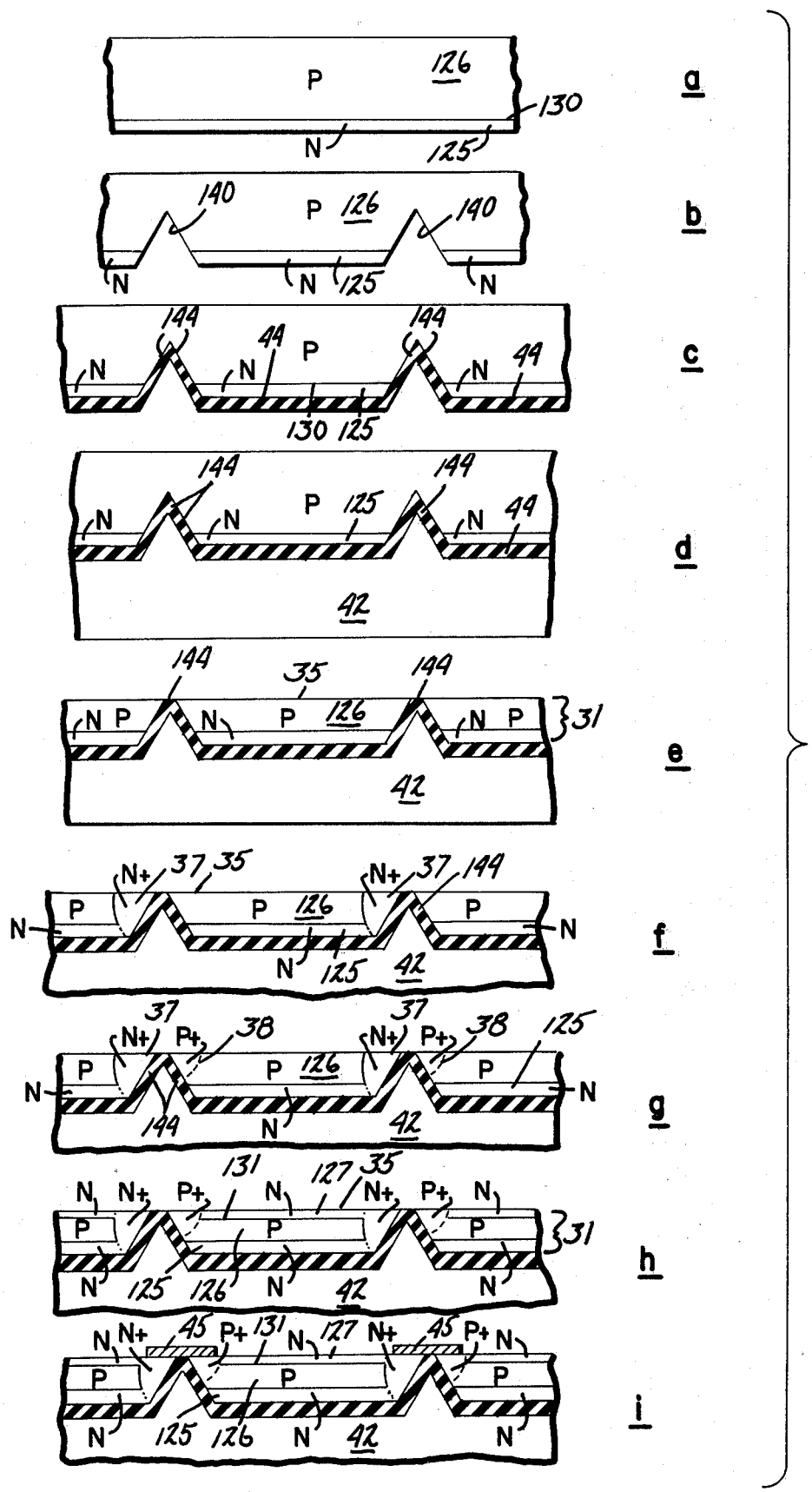
FIGS. 29($a$) through 29($i$) are diagrammatic illustrations of sequential processing steps for practising one method of constructing a monolithic high-voltage photovoltaic cell array according to the principles of this invention, when using dielectric barrier inter-cell isolation techniques.

Monolithic arrays of photovoltaic cells which accomplish inter-cell isolation directly by means of dielectric barriers may be rapidly, simply and efficiently produced by use of standard monolithic integrated circuit fabrication techniques. One technique of fabricating a monolithic photovoltaic array such as that illustrated in FIGS. 26–28, will be described with reference to FIG. 29. Referring to FIG. 29, the major processing steps for fabricating a dielectric barrier isolated, two-photovoltaic junction array are sequentially illustrated. It will be noted that for simplifying the description, like parts carry like numeral designations in FIGS. 26–28 and FIG. 29.

The basic starting material (FIG. 29a) comprises a body of single-crystalline semiconductor material 31 having a relatively thick first layer of (p) type material 126 and a second thinner layer of (n) type material 125. The intersection of the (p) type and the (n) type layers 126 and 125 respectively define the photovoltaic junction 130. The p–n junction 130 may be formed either by means of epitaxial growth or diffusion methods.

The first processing step leading to formation of the dielectrically isolating barriers comprises cutting or chemically etching (or a combination of the two) a series of grooves 140 (FIG. 29b) into the single-crystalline semiconductor material. The grooves extend entirely through the (n) type layer 125 and partially into the (p) type layer 126. The next processing step (FIG. 29c) comprises the step of coating the lower surface of the single-crystalline semiconductor material with an insulating material. In the preferred embodiment, this step is achieved by depositing a layer of silicon dioxide over the eentie lower surface of the base single-crystalline semiconductor material, to form what will become the dielectrically insulating layer 44 and the dielectric extensions or barriers 144 continuously projecting into single-crystalline semiconductor material along the grooves 140.

The third processing step (FIG. 29d) comprises the formation of a relatively thick layer of non-monocrystalline semiconductor material on top of the dielectrically insulating layer 44 and associated dielectric barrier portions 144, to form the supporting substrate body 42 of the photovoltaic array. The fourth processing step comprises the mechanical or chemical lapping and polishing of the "top" of the upper (p) type layer 126 of the single-crystalline semiconductor material to a depth so as to expose the dielectrically isolating barriers 144. Completion of the lapping and polishing processing step defines the thin upper layer of single-crystalline semiconductor material 31, and electrically isolates portions of the thin single-crystalline semiconductor layer 31 which lie on oppositely disposed sides of the dielectrically insulating barriers 144. This processing step also defines the upper irradiated surface 35 of the photovoltaic array, (see FIG. 29e).

The fifth processing step (FIG. 29f) comprises masking of the upper surface 35 of the thin layer of single-crystalline semiconductor material 31 via standard masking techniques to selectively diffuse a plurality of heavily doped (n+) type zones 37 extending from the upper irradiated surface 35 and into conductive engagement with the underlying (n) type sublayer 125. One each of such (n+) type zones is diffused into each of the isolated portions of the upper thin layer of single-crystalline semiconductor material 31 which is to become a photovoltaic cell, for forming the cathode electrode thereof. The sixth processing step (FIG. 29g) comprises the selective masking for and the diffusion of heavily doped (p+) type zones 38 extending from the upper irradiated surface 35 into conductive engagement with the underlying (p) sublayer 126, to form the anode terminal for each of the isolated photovoltaic cells of the array. It will be understood that while only two sublayers of the thin upper layer of single-crystalline semiconductor material 31 are illustrated in FIG. 29, if a plurality of such sublayers were present, the heavily doped (n+) electrode zones would respectively extend into the thin upper layer 31 so as to conductively engage each underlying (n) type and (p) type sublayer respectively.

The seventh processing step (FIG. 29h) comprises a low-temperature diffusion of a low concentration (n) type dopant through the upper irradiated surface 35 of the array to form the second (n) type layer 127 of the thin single-crystalline semiconductor layer 31. The intersection of the (n) type layer 127 with the underlying (p) type layer 126 defines the second photosensitive p–n junction 131 of each of the isolated photovoltaic cells and completes the formation of each of the two-junction isolated photovoltaic cells of the array. The final processing step (FIG. 29i) is to deposit in selected interconnecting patterns, metal interconnections 45 between selected ones of the (n+) and (p+) electrode zones for electrically connecting in series and/or parallel the individual isolated photovoltaic cells for configuring the final photovoltaic array to satisfy the design voltage and current requirements therefore.

While a specific processing sequence has been described for constructing the dielectric barrier isolated photovoltaic cell array, it will be understood that any variations of this process and alternate processes can be employed within the spirit and intent of this invention. Further, while three sublayers of the thin single-crystalline semiconductor layer 31 have been illustrated, it will be understood that any number of such sublayers could be employed, and that while various relative thicknesses of the individual cell layers have been illustrated, such relative thicknesses can be altered to satisfy design and/or processing constraints, all within the spirit and intent of this invention.

Thus, use of either of the dielectric isolation principles described, enables monolithic arrays of photovoltaic cells to be configured for producing practically any desired output voltage, regardless of how high that voltage may be, without needless considerations regarding inter-cell isolation. This design freedom results from the fact that the only limiting isolation factor is the thickness of the insulating layer or substrate, which can be constructed to any desired thickness. The extreme fault-tolerant nature of this method coupled with the simplicity of fabrication, provides extremely high yields in the fabrication of such devices, significantly cutting fabrication costs thereof.

Of prime importance to the designer, is the fact that by designing a photovoltaic cell array according to the dielectric isolation principles taught by this invention, he now has an added design dimension which he can use to his advantage. He can now, at will, trade-off in monolithic form, the current and voltage characteristics of his photovoltaic power source without needless concern for hybrid techniques heretofore required by the prior art techniques for interconnecting individual photovoltaic cells to achieve the same options.

It will be apparent to those skilled in the art that the illustrations depicted in the figures relative to the widths of the elongate (n+) and (p+) zones are clearly out of proportion relative to the interzone widths of the single sublayers of single-crystalline material therebetween--it being understood that the figures are diagrammatic only. In practice, the plurality of elongate (p+) and (n+) zones can be designed to occupy only 2 percent of the total irradiated surface area of the photovoltaic array 80, leaving 98 percent of the irradiated surface areas and underlying active junction of the array available for the active production of photo current.

A photovoltaic array constructed according to the principles of this invention with the additional efficiency-increasing features of interdigitated (p+) and (n+) heavily doped zones and a plurality of alternating (p) and (n) type sublayers, providing significantly increased active junction area and substantially reduced parasitic series resistance of individual cells respectively is illustrated in FIGS. 15 through 18. The individual cells in FIGS. 15 through 18, are generally constructed according to the principles previously outlines with respect to FIGS. 4 through 10, and will not be detailed herein.

Figure 22:
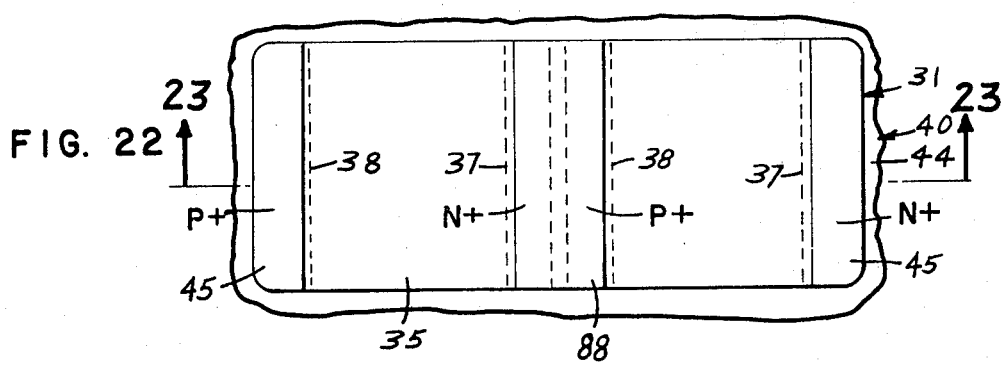
FIG. 22 is a diagrammatic illustration, in top plan, of a third embodiment of a monolithic photovoltaic multiple-cell array configured according to the principles of this invention.
Figure 23:
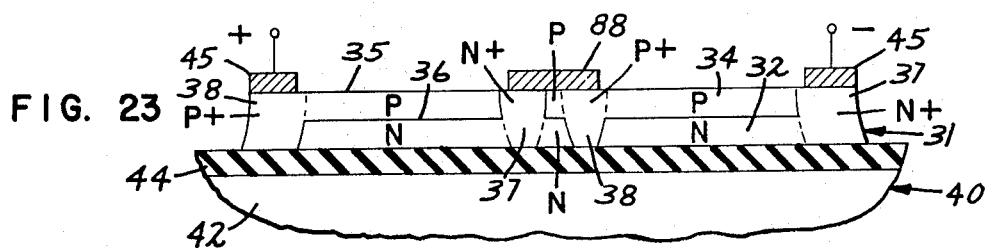
FIG. 23 is a diagrammatic illustration, in cross section, of a photovoltaic cell array disclosed in FIG. 22, generally viewed along the Line 23—23 in FIG. 22.

An embodiment of a multiple photovoltaic cell array employing the principles of this invention wherein the intermediate elongate (n+) and (p+) type heavily doped zones are closely adjacent to, but do no overlap one another, is illustrated in FIGS. 22 and 23. Referring thereto, it will be noted that where the elongate heavily doped intermediate (n+) and (p+) zones of the semiconductor material, do not overlap, an overlying metal stripe, designated as 88, is required to provide a conductive path for the carriers from the heavily doped upper surface of one conductivity type zone to the upper surface of the adjacent heavily doped zone of the opposite conductivity type.

Figure 24:
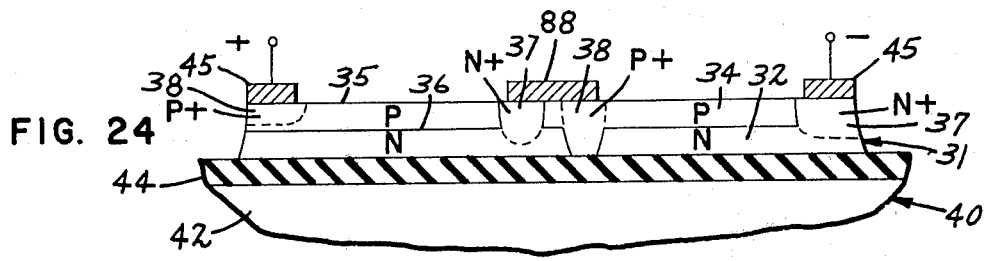
FIG. 24 is a diagrammatic illustration, in cross section, of a monolithic photovoltaic multiple-cell array having a top plan view as illustrated in FIG. 23, generally as viewed along the Line 23—23 thereof, illustrating an alternate variation of electrode and cell-defining elongate heavily doped zones according to the principles of this invention.

FIG. 24 illustrates the situation wherein the respective elongate (p+) and (n+) zones extend into the underlying sublayers of single-crystalline semiconductor material within the thin layer 31 thereof only as far as required to accomplish the principles of this invention.

Many efficiency-improving features can be readily incorporated into the basic monolithic photovoltaic cell and dielectrically isolated array structures of this invention. One such feature is illustrated, with reference to the basic single photovoltaic cell, in FIG. 3. Referring thereto, a reflective layer of material 90 such as chromium or the like is disposed below the transparent dielectrically insulating layer 44, for reflecting energetic electromagnetic radiation passing through the thin single-crystalline upper layer 31 and the underlying insulating layer 44 back into the thin single-crystalline layer 31. The reflective feature is particularly desirable when used with the principles of this invention for increasing the efficiency of the photovoltaic cells since the layer 31 of thin single-crystalline material is sufficiently thin to enable a substantial portion of the energetic electromagnetic radiation passing therethrough to be reflected back into the thin layer 31 for reuse in generating additional photovoltaic current. It will be understood that while not illustrated in the drawing, the reflective layer 90 could equally well be applied to the substrate configuration employing a relatively thick insulating transparent substrate material such as sapphire or spinel, as in FIG. 2A.

The reflective layer 90 may also be positioned so as to overlie the dielectric insulating layer 44. Use of this alternate configuration of the reflective layer 90 is particularily useful when applied to the photovoltaic cell arrays which use the dielectric barrier technique for inter-cell isolation. An example of such use is illustrated in FIG. 31. Referring to FIG. 31, the basic array structure disclosed in FIG. 26 is illustrated in cross section as it would appear when viewed along the Line 27—27 of FIG. 26, if the individual photovoltaic cells 120 and 121 were structured to include the overlying reflective layer 90 and the high-low junction (to be hereinafter described) efficiency-improving features. In the processing of such a structure, the reflective metal layer 90 would be deposited over the bottom surface of the single-crystalline semiconductor material prior to formation of the grooves 140 (FIG. 29b) therein. When the overlying reflective layer 90 is employed with those photovoltaic cell arrays which do not use the dielectric barrier inter-cell isolation techniques, caution must be exercised to insure that the reflective layer 90 does not extend through the overlapping or closely adjacent heavily doped (n+) and (p+) zones, to prevent electrical shorting of adjacent photovoltaic cells.

Figure 25:
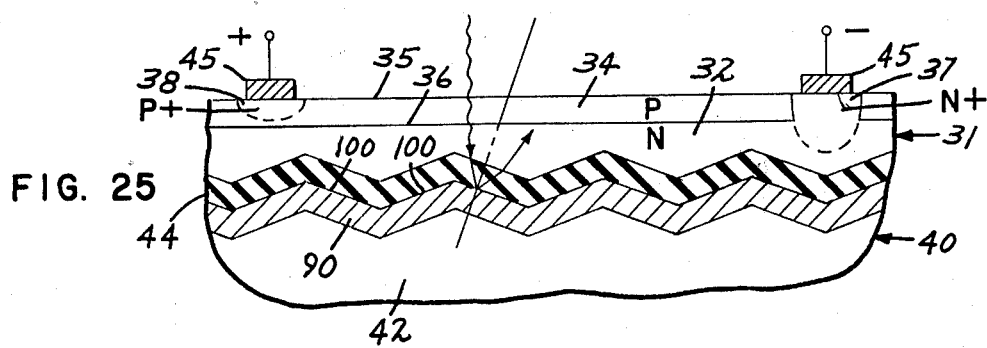
FIG. 25 is a diagrammatic illustration, in cross section, of an individual photovoltaic cell constructed according to the principles of this invention, illustrating reflective means underlying an insulating dielectric layer for causing multiple-pass internal reflections of energetic electromagnetic radiation accepted by the cell.

Another efficiency-increasing feature which may be readily incorporated with either of the reflective layer features is the use of multi-pass reflection means in cooperation with the reflective layer 90 to cause total internal reflection of energetic electromagnetic radiation striking the reflective surface 90 within the thin layer of single-crystalline semiconductor material 31. One embodiment of a multi-pass technique incorporated with the principles of this invention is disclosed in FIG. 25. Referring thereto, it will be noted that the insulating layer 44 is shaped so as to have a plurality of surfaces 100 oriented obliquely to the upper irradiated surface 35 of the photovoltaic cell to reflect energetic electromagnetic radiation passing through the thin layer 31 back into the thin layer of single-crystalline semiconductor material at predetermined angles for causing multiple reflections thereof once the reflected energetic electromagnetic radiation re-enters the thin layer of single-crystalline semiconductor 31. This feature is particularly well adapted to this invention to this invention since the thinness of the single-crystalline semiconductor layer 31 provides maximum multiple-pass reflections therein from any received energetic electromagnetic radiation, making any photovoltaic cell which incorporates this feature and which is structured according to the teachings of this invention, highly practical for reduced illumination environments.

Another efficiency-improving feature that can be incorporated with any of the photovoltaic cell and array embodiments of this invention is the use of a "high-low" junction disposed to underlie the lowermost $p-n$ junction of the thin upper layer of single-crystalline semiconductor material 31. Use of the high-low junction feature as employed with the basic single photovoltaic cell structure is disclosed in FIG. 30. Referring thereto, the thin upper layer of single-crystalline semiconductor material 31 is illustrated as being subdivided into an upper (n) type layer 150 and a lower (p) type layer 151 overlying the supportive substrate which includes an upper dielectric layer 44. The intersection of the (n) and (p) type layers defines the photovoltiac $p-n$ junction 152 of the cell. A layer of heavily doped (p+) conductivity type 153 overlies the dielectric layer 44 and forms with the overlying (p) type layer 151 a highly or heavily doped/lowly or lightly doped (p+)-(p) junction [typically referred to as a "high-low" junction] 154, which substantially underlies the entire area of the photosensitive p–n junction 152. The high-low junction 152 produces an electric field for urging minority carriers within the thin layer of single-crystalline semiconductor material 31 toward the overlapping p–n junction 152, and enhances lateral conductivity within the thin layer 31, thus increasing the cell's efficiency.

The elongate (n+) and (p+) electrode zones 37 and 38 respectively are diffused into the thin layer 31, as previously described, to provide low conductivity current paths for majority carriers from the sublayers of the thin single-crystalline semiconductor layer 31 to the upper irradiated surface 35. Note that while the heavily doped (p+) electrode zone 38 is illustrated in FIG. 30 as extending entirely down to the dielectric layer 44 and into conductive engagement with the heavily doped (p+) layer 153, the (p+) electrode zone and the underlying (p+) layer 153 need not necessarily be in direct contact with one another to achieve the efficiency-increasing benefits of this feature. However, it will be understood that when the high-low junction feature is employed in photovoltaic cells of a monolithic array which employs overlapping or closely adjacent (n+) and (p+) zone diffusions in cooperation with an underlying dielectric layer for achieving inter-cell dielectric isolation, the overlapping or closely adjacent heavily doped (n+) and (p+) zones must still retain those characteristics previously discussed for achieving inter-cell isolation. In the FIG. 30 structure, it will be noted that the heavily doped (p+) layer 153 does not extend entirely into conductive engagement with the (n+) electrode diffusion 37. Such a configuration could be achieved by proper masking when forming the lower (p+) layer 153. It should be noted however, that the lower (p+) layer 153 could extend entirely acros the photovoltaic cell, as long as the resistivity of the (p+) layer 153 is controllably held to a reduced level such that an (n+) electrode zone diffusion can be effectively achieved through the (p+) layer 153 to accomplish inter-cell isolation in a photovoltaic array, as previously discussed.

Use of the high-low efficiency-increasing feature just described is illustrated in FIG. 31 as applied to the photovoltaic cell array technique which employs dielectric barrier inter-cell isolation techniques. Referring to FIG. 31, a high-low junction 160 is formed between the lowly doped lowermost (n) layer 125 and a highly doped (n+) sublayer 161. Referring to FIG. 29, it will be noted that in the processing sequence of forming a photovoltaic cell array which achieves inter-cell isolation by means of dielectrically insulating barriers 144, the high-low junction would be formed between those processing steps described with respect to FIGS. 29a and 29b, by diffusing or growing by means of epitaxial growth methods, a highly doped (n+) layer into (or onto) the lowermost (n) layer 125, prior to formation of the grooves 140 into the starting semiconductor material.

An embodiment of the invention including many of the efficiency-improving features in a dielectrically isolated array of photovoltaic cells constructed according to the principles of this invention is disclosed in FIGS. 19 and 20. Referring thereto, the photovoltaic array includes the features of multiple p–n junctions within the thin layer 31 of single-crystalline semiconductor material for exposure to energetic electromagnetic radiation, interdigitated electrode extensions 60 and 62 for reducing parasitic series cell resistance, a reflective layer 90 underlying a thin dielectric layer 44 for reflecting energetic electromagnetic radiation back into the thin layer of single-crystalline semiconductor material 31, and a heavily doped dielectric layer 78 overlying the thin single-crystalline semiconductor material layer 31 for producing an inversion layer for capturing carriers produced by blue light incident upon the photovoltaic array. It should be noted that the multi-pass and the high-low junction features could equally well be applied with the combination illustrated.

It should be recognized that the efficiency-increasing principles of: multiple stacked junctions essentially parallel to the upper irradiated surface for increasing the active junction area; a plurality of interdigitated comb-lie electrode extensions for decreasing parasitic equivalent series resistance; inversion layer generating means for capturing blue light energy; the reflective layer either overlying or underlying the dielectric isolating layer and either with or without multiple-pass features; and the high-low junction for urging carriers toward the photosensitive p–n junctions, can be applied simultaneously or in any combination to maximize the efficiency of any particular solar cell or photovoltaic cell array configuration.

A photovoltaic cell array that achieves inter-cell isolation directly by means of the dielectric barrier technique and which employs simplified photovoltaic cell construction is illustrated in FIGS. 32 and 33. Referring thereto, the underlying dielectric layer 44 and its extending barrier portions 144 perfom the inter-cell isolation functions, as previously described. The structure illustrated employs the optional efficiency-increasing reflective layer 90 which overlies the dielectric layer 44. The thin layer of single-crystalline material 31 comprises a (p) type conductivity layer 170 and an upper heavily doped (n+) layer 171 which also doubles as the (n+) type electrode contact for the respective photovoltaic cells. The (p+) type electrode 38 is configured as previously described, to provide a low-conductivity path for majority carriers from the (p) layer 170 to the upper irradiated surface 35. Each cell of the structure also includes a high-low junction 172 formed by the intersection of a highly doped lower (p+) layer 173 with the (p) layer 170. Series connection of adjacent cells is achieved by means of a metallization pattern 175 at the upper irradiated surface 35. The metallization pattern may be configured to include elongate comb-like extensions as illustrated. It will be recognized that use of an upper (n+) layer 171, which doubles as both a photosensitive junction-forming element and the negative electrode for the cell, greatly simplifies the basic photovoltaic cell structure.

Other modifications of the invention will be apparent to those skilled in the art in light of the foregoing description. The description is intended to provide concrete examples of individual embodiments clearly disclosing the present invention. Accordingly, the invention is not limited to any particular embodiment, and various combinations of the efficiency-increasing features of this invention are anticipated. All alternatives, modifications and variations of the present invention which fall within the spirit and broad scope of the appended claims are covered.

What is claimed is:
1. A monolithic solar cell, comprising:

a. a body of dielectric material;
b. a thin layer of single-crystalline semiconductor material overlying said dielectric body and having at least one broad surface suitable for exposure to energetic electromagnetic radiation, comprising:
  i. a layer of first conductivity type directly overlying said dielectric material; and
  ii. a layer of second conductivity type overlying said first conductivity type layer, the intersection of said first and said second conductivity type layers forming a p–n junction in said thin single-crystalline layer in a plane essentially parallel to said one surface and substantially underlying the entire area of said one surface;
c. an elongate heavily doped zone of said first conductivity type continuously extending from said one surface, through said second conductivity type layer and through said p–n junction into said first conductivity type layer, providing a low-impedance current path for majority carriers from said first conductivity type layer to said one surface; and
d. an elongate heavily doped zone of said second conductivity type extending from said one surface into said second conductivity type layer, providing a low-impedance current path for majority carriers from said second conductivity type layer to said one surface.

2. A monolithic solar cell as recited in claim 1, further including a relatively thick supportive substrate of non-monocrystalline material, and wherein said body of dielectric material comprises an insulating layer of such dielectric material overlying said supportive substrate.

3. A monolithic solar cell as recited in claim 1, wherein said elongate heavily doped zones of first and second conductivity types are respectively spaced apart from one another and are laterally disposed relative to said one surface along opposite ends thereof.

4. A monolithic solar cell as recited in claim 3, wherein each of said heavily doped zones comprises at least one extension thereof projecting outwardly from the longitudinal direction of its respective said zone and in a direction toward said zone of the opposite conductivity type, said zone extensions being operative to decrease the equivalent series resistance of said solar cell.

5. A monolithic solar cell as recited in claim 4, wherein each of said heavily doped zones comprises a plurality of said extensions of narrow cross-sectional width projecting in comb-like manner from their respective zones, said narrow comb-like extensions being alternately interdigitated by conductivity type in spaced relationship relative to one another across said one surface in the longitudinal direction of said zones.

6. A monolithic solar cell as recited in claim 5, further including metallic means bonded in low resistance ohmic contact to said one surface in those areas substantially overlying said elongate heavily doped zones of said first and said second conductivity types and their respective said comb-like extensions for providing low-impedance conductivity paths from said heavily doped zones.

7. A monolithic solar cell as recited in claim 1, further including reflective means disposed below at least a portion of said dielectric material for reflecting energetic electromagnetic radiation received through said one surface and passing through said thin layer of single-crystalline semiconductor material, back into said thin layer of semiconductor material.

8. A monolithic solar cell as recited in claim 7, wherein said reflective means comprises one or more reflective surfaces oriented non-parallel to said one surface and disposed below at least a portion of said dielectric material for causing multiple internally reflective traversals through said thin semiconductor layer of said received energetic electromagnetic radiation.

9. A monolithic solar cell as recited in claim 1, further including reflective means disposed immediately above at least a portion of said dielectric material for reflecting energetic electromagnetic radiation received through said one surface and passing through said thin layer of single-crystalline semiconductor material, back into said thin layer of semiconductor material, back into said thin layer of semiconductor material.

10. A monolithic solar cell as recited in claim 9, wherein said reflective means comprises one or more reflective surfaces oriented non-parallel to said one surface and disposed immediately above at least a portion of said dielectric material for causing multiple internal reflective traversals through said thin semiconductor layer of said received energetic electromagnetic radiation.

11. A monolithic solar cell as recited in claim 1, wherein said thin layer of single-crystalline semiconductor material comprises a plurality of alternating said first and said second conductivity type layers forming a plurality of p-1 -n junction planes having alternating polarity thereacross in the direction normal to said one surface; wherein said elongate heavily doped zone of said first conductivity type extends continuously from said one irradiated surface into direct conductive engagement with each of said first conductivity type layers; and wherein said elongate heavily doped zone of said second conductivity type extends continuously from said irridated surface into direct conductive engagement with each of said second conductivity type layers.

12. A monolithic solar cell as recited in claim 1, further including metallic means bonded in low-resistance ohmic contact to said one surface in those areas substantially overlying said elongate heavily doped zones of said first and said second conductivity types for providing low-impedance conductive paths from said heavily doped zones.

13. A monolithic solar cell as recited in claim 1, further including means on said one surface overlying at least a portion of said second conductivity type layer for forming an inversion layer at said one surface and producing photocurrent thereat when exposed to blue light.

14. A monolithic solar cell as recited in claim 1, wherein said dielectric material comprises a relatively thick supportive substrate of transparent insulating material such as sapphire or magnesium aluminum spinel, and wherein said thin single-crystalline semiconductor layer overlying said transparent substrate material is formed by epitaxial growth methods.

15. A monolithic solar cell as recited in claim 14, further including reflective means on the bottom of said transparent substrate material for reflecting energetic electromagnetic radiation back into said thin layer of semiconductor material.

16. A monolithic solar cell as recited in claim 1, wherein said thin layer of single-crystalline semiconductor material further comprises a heavily doped layer of first conductivity type disposed below said p-n junction and underlying at least a portion thereof, the intersection of said first conductivity type layer and said heavily doped first conductivity type layer forming a high-low junction of the first conductivity type layer forming a high-low junction of the first conductivity type.

17. A semiconductor body, comprising:
 a. a supportive substrate having at least an upper layer of electrically insulating material;
 b. a thin layer of single-crystalline semiconductor material overlying said substrate and having an upper surface for receiving energetic electromagnetic radiation, comprising:
  i. a first conductivity type layer directly overlying said insulating substrate material; and
  ii. a second conductivity type layer directly overlying said first conductivity type layer, the intersection of said first and said second conductivity type layers forming a first p-n junction in a plane essentially parallel to said irradiated upper surface and substantially underlying the entire area of said upper surface;
 c. a first elongate zone of heavily doped said first conductivity type extending continuously from said irradiated upper surface into said first conductivity type layer, providing a low-impedance current path for majority carriers from said first conductivity type layer to said upper surface; and
 d. a second elongate zone of heavily doped said second conductivity type extending continuously from said irradiated upper surface into said channel conductivity type layer, providing a low-impedance current path for majority carriers from said second conductivity type layer to said upper surface.

18. A semiconductor body as recited in claim 17, wherein said continuous thin layer of single-crystalline semiconductor material comprises at least a second layer of said first conductivity type material, the intersection of said second layer of first conductivity type material with said layer of second conductivity type material forming a second p-n junction in a plane essentially parallel to said irradiated upper surface and having a polarity thereacross opposite to that across said first p-n junction in a direction normal to said irradiated upper surface; and wherein said first elongate zone extends continuously from said irradiated upper surface into direct conductive engagement with each of said first conductivity type layers, providing a low-impedance current path for majority carriers from each of said first conductivity type layers to said upper surface.

19. A semiconductor body as recited in claim 17, further including a plurality of each of said first and said second elongate zones aligned generally parallel to one another, and successively alternating between zones of said first and said second conductivity types, each zone extending entirely across said thin layer of single-crystalline material in one lateral direction thereof; wherein successive pairs of said plurality of first and second elongate zones are alternatively widely spaced and closely adjacent respectively relative to one another; wherein those second conductivity type ones of said closely adjacent elongate zones continuously extend from said upper surface and entirely through said first and said second conductivity type layers into engagement with said underlying insulating substrate such that each portion of said semiconductor body disposed between successive widely spaced ones of said elongate zones comprises a photovoltaic solar cell, with said closely adjacent pairs of said elongate zones in combination with said insulating layer providing electrical isolation between adjacent said solar cells; and wherein said semiconductor body further comprises metallic means on said upper surface bonded in low-resistance resistance ohmic contact to each of said plurality of closely adjacent elongate zones and bridging any intermediate space between said zones within each of said closely adjacent pairs thereof for electrically connecting in series adjacent ones of said solar cells.

20. A semiconductor body as recited in claim 19, wherein said supportive substrate comprises a relatively thick lower layer of non-monocrystalline material and an overlying relatively thin layer of dielectric insulating material.

21. A semiconductor body as recited in claim 20, further including reflective means disposed below at least a portion of said thin layer of single-crystalline material for reflecting energetic electromagnetic radiation received through said upper surface and passing through said thin layer of single-crystalline semiconductor material.

22. A semiconductor body as recited in claim 21, wherein said reflective means comprises one or more reflective surfaces oriented non-parallel to said irradiated surface and disposed below at least a portion of said thin single-crystalline material layer for causing multiple internal reflective traversals of said received energetic electromagnetic radiation through said thin single-crystalline semiconductor layer.

23. A semiconductor body as recited in claim 19, wherein each of said first and second elongate zones within at least one of said widely spaced pairs thereof within a said solar cell includes a plurality of narrow extensions projecting in comb-like manner outwardly from its said respective zone within that said widely spaced pair, with said narrow comb-like extensions being interdigitated by alternating conductivity type in spaced relationship relative to one another in the longitudinal direction of said zones proper, for decreasing the equivalent series resistance of that said solar cell.

24. A semiconductor body as recited in claim 19, further including means overlying at least a portion of said irradiated upper surface of said thin layer of single-crystalline semiconductor material for forming an inversion layer at said upper surface, producing photocurrent thereat when exposed to blue light energy.

25. A semiconductor body as recited in claim 19, wherein said continuous thin layer of single-crystalline semiconductor material comprises at least a second layer of said first conductivity type material overlying said layer of second conductivity type material, the intersection of said second layer of first conductivity type material with said layer of second conductivity type material forming a second p-n junction in a plane essentially parallel to said irradiated upper surface and having a polarity thereacross opposite to that across said first p-n junction in a direction normal to said irradiated upper surface; and wherein said plurality of first elongate zones extend continuously from said irradiate upper surface into direct conductive engagement with each of said first conductivity type layers, providing a low-impedance current path for majority carriers from each of said first conductivity layers to said upper surface.

26. A semiconductor body as recited in claim 19, wherein said supportive substrate comprises a relatively thick body of transparent insulating material such as sapphire or magnesium aluminum spinel, and wherein said thin single-crystalline semiconductor layer overlying said transparent substrate material is formed by epitaxial growth methods.

27. A semiconductor body as recited in claim 26, further including reflective means on the bottom of said transparent substrate body for reflecting energetic electromagnetic radiation back into said thin layer of single-crystalline semiconductor material.

28. A semiconductor body as recited in claim 19, wherein those said first and said second conductivity type elongate zones comprising at least one of said closely adjacent pairs thereof are formed by diffusion methods and at least partially overlap one another.

29. A semiconductor body as recited in claim 19, wherein said thin layer of single-crystalline semiconductor material further comprises a heavily doped layer of first conductivity type disposed below said p-n junction and underlying at least a portion thereof, the intersection of said first conductivity type layer and said heavily doped first conductivity type layer forming a high-low junction of the first conductivity type.

30. A semiconductor body as recited in claim 17, further including a plurality each of said first and said second elongate zones aligned generally parallel to one another, and successively alternating between zones of said first and said second conductivity types, each zone extending entirely across said thin layer of single-crystalline material in one lateral direction thereof; wherein successive pairs of said plurality of first and second elongate zones are alternatively widely spaced and partially overlapping respectively relative to one another; wherein those second conductivity type ones of said partially overlapping elongate zones continuously extend from said upper surface and entirely through said first and said second conductivity type layers into engagement with said underlying insulating substrate such that each portion of said semiconductor body disposed between successive widely spaced ones of said eloganate zones comprises a photovoltaic solar cell, with said partially overlapping pairs of said elongate zones in combination with said insulating layer simultaneously providing electrical isolation between and connection in electrical series of adjacent said solar cells.

31. A semiconductor body as recited in claim 17, further including: a third elongate zone of heavily doped said first conductivity type extending continuously from said irradiated upper surface into said first conductivity type layer to provide a low-impedance current path for majority carriers from said first conductivity type layer to said upper surface; a fourth elongate zone of heavily doped said second conductivity type extending continuously from said irradiated upper surface into said second conductivity type layer to provide a low-impedance current path for majority carriers from said second conductivity type layer to said upper surface, said third and fourth elongate zones being disposed closely adjacent one another and intermediate said first and said second elongate zones, with said fourth elongate zone addressing said first zone and with said third zone addressing said second zone; a dielectrically insulating barrier member disposed intermediate said tird and fourth elongate zones, continuously upwardly extending from said substrate layer of electrically insulating material and entirely through said thin layer to said upper surface thereof, and extending entirely across said thin layer to electrically isolate those portions of said thin layer disposed on opposite sides of said insulating barrier member, such that each isolated portion of said thin layer comprises a photovolaic solar cell.

32. A semiconductor body as recited in claim 31, further including metallic means on said upper surface of said thin layer of single-crystalline semiconductor material, bonded in low-resistance ohmic contact to said third and said fourth elongate zones and bridging said insulating barrier member at said upper surface of said thin layer for electrically connecting in series the isolated solar cells.

33. A semiconductor body as recited in claim 17, further including: a third elongate zone of heavily doped said first conductivity type extending continuously from said irradiated upper surface into said first conductivity type layer, to provide a low-impedance current path for majority carriers from said first conductivity type layer to said upper surface; a fourth elongate zone of heavily doped said second conductivity type extending continuously from said irradiated upper surface into said second conductivity type layer, to provide a low-impedance current path for majority carriers from said second conductivity type layer to said upper surface; a first dielectrically insulating barrier member continuously upwardly extending from said substrate layer of electrically insulating material and entirely through said thin layer to said upper surface thereof and surrounding in moat-like manner that portion of said thin layer containing said first and said second elongate zones, to define a first dielectrically isolated photovoltaic cell; and a second dielectrically insulating barrier member continuously upwardly extending from said substrate layer of electrically insulating material and entirely through said thin layer to said upper surface thereof and surrounding in moat-like manner that portion of said thin layer containing said third and said fourth elongate zones, to define a second dielectrically isolated photovoltaic cell.

34. A semiconductor body as recited in claim 33, further including metallic means on said upper surface of said thin single-crystalline semiconductor material bonded in lowresistance ohmic contact to said second and said third elongate zones and bridging said first and said second insulating barrier members at said upper surface of the thin layer for electrically connecting in series said first and said second isolated photovoltaic cells.

35. A semiconductor body as recited in claim 33, further including first metallic means on said upper surface of said thin single-crystalline semiconductor material bonded in low-resistance ohmic contact to said first and said third elongate zones and bridging said first and said second insulating barrier members at said upper surface of said thin layer; and second metallic means on said upper surface of said thin single crystalline semiconductor material bonded in low-resistance ohmic contact to said second and said fourth elongate zones and bridging said first and said second insulating barrier members at said upper surface of said thin layer, said first and said second metallic means electrically connecting in parallel said first and said second photovoltaic cells.

36. A monolithic high-voltage solar cell array, comprising:
  a. a supportive substrate having at least an upper layer of electrically insulating material;
  b. a thin layer of single-crystalline semiconductor material overlying said supportive substrate and having an upper surface suitable for receiving energetic electromagnetic radiation, comprising at least one sublayer each of first and second conductivity type materials respectively, said sublayers being stacked upon one another to form a p-n junction in a plane essentially parallel to said irradiated upper surface; and
  c. a pattern of elongate generally parallel diffused zones of heavily doped said first and said second conductivity types extending entirely across said thin layer of single-crystalline material in one lateral direction thereof, comprising:
    i. a plurality of first elongate zones of heavily doped said first conductivity type extending continuously from said irradiated upper surface into said first conductivity type sublayer, providing a low-impedance current path for majority carriers from said first conductivity type sublayer to said upper irradiated surface;
    ii. a plurality of second elongate zones of heavily doped said second conductivity type extending continuously from said irradiated upper surface into said second conductivity type sublayer, providing a low-impedance current path for majority carriers from said second conductivity type sublayer to said irradiated upper surface; and
    iii. the configuration of said zone pattern being characterized by: said plurality of elongate zones being disposed across said thin semiconductor layer by successively alternating said first and said second conductivity types; successive pairs of said plurality of first and second elongate zones being alternately widely spaced and partially overlapping respectively relative to one another; and those ones of said overlapping elongate zones having conductivity types opposite to that of the lowermost one of said stacked sublayers extending continuously from said upper surface and entirely through said thin semiconductor layer to said underlying insulating substrate material, defining a photovoltaic solar cell from those portions of said thin semiconductor layer disposed between successive pairs of overlapping elongate zones, wherein said overlapping zones in combination with said insulating layer simultaneously electrically isolate adjacent ones of said solar cells from one another while permitting electrical series connection thereof.

37. A monolithic high-voltage solar cell array as recited in claim 36, wherein said supportive substrate comprises a relatively thick lower layer of non-monocrystalline material and an overlying relatively thin layer of dielectrically insulating material.

38. A monolithic high-voltage solar cell array as recited in claim 37, further including reflective means disposed below at least a portion of said thin layer of single-crystalline material layer for reflecting energetic electromagnetic radiation passing through said thin layer back into said single-crystalline semiconductor material.

39. A monolithic high-voltage solar cell array as recited in claim 38, wherein said reflective means comprises one or more reflective surfaces oriented non-parallel to said irradiated surface and disposed below at least a portion of said thin single-crystalline semiconductor layer for causing multiple internal traversals of said received energetic electromagnetic radiation through said thin single-crystalline semiconductor layer.

40. A monolithic high-voltage solar cell array as recited in claim 36, wherein said p-n junction formed within said thin layer of single-crystalline semiconductor material lies approximately in the medium plane of said thin layer of single-crystalline material.

41. A monolithic high-voltage solar cell array as recited in claim 36, wherein said thin layer of single-crystalline semiconductor material comprises a plurality of each of said sublayers of said first and said second conductivity types stacked upon one another according to alternating said first and said second conductivity types to form a plurality of p-n junctions in planes essentially parallel to said irradiated upper surface and having alternating polarities thereacross in the direction normal to said one surface; wherein said elongate stripes extend entirely across said thin layer of single-crystalline material in one lateral direction thereof; wherein said plurality of first elongate zones extend continously from said irradiated upper surface into conductive engagement with each of said first conductivity type sublayers; and wherein said plurality of second elongate zones extend continuously from said irradiated upper surface into conductive engagement with each of said second conductivity type sublayers.

42. A monolithic high-voltage solar cell array as recited in claim 36, wherein each of said first and second widely spaced elongate zones within at least one of said defined solar cells includes a plurality of narrow extensions projecting in comb-like manner outwardly from its said respective zones in the direction toward the oppositely disposed one of said widely spaced elongate zones within that solar cell, said narrow comb-like extensions being interdigitated by alternating conductivity types in spaced relationship relative to one another in the longitudinal direction of said zones, for decreasing the equivalent series resistance of that said solar cell.

43. A monolithic high-voltage solar cell array as recited in claim 36, further including means overlying at least a portion of said irradiated upper surface of said thin layer of single-crystalline semiconductor material for forming an inversion layer at said upper surface for capturing carriers thereat when exposed to blue light within the spectrum of said energetic electromagnetic radiation.

44. A monolithic high-voltage solar cell array as recited in claim 33 wherein the lowermost sublayer of said thin layer of single-crystalline semiconductor material further comprises a heavily doped layer of like conductivity type disposed below said p-n junction and underlying at least a portion thereof, the intersection of said lowermost sublayer and said heavily doped layer forming a high-low junction of like conductivity type.

45. A monolithic single-crystalline semiconductor body, comprising:
  a. a relatively thick supportive substrate layer of first conductivity type single-crystalline material;
  b. a thin layer of second conductivity type single-crystalline semiconductor material overlying said substrate layer and having an upper surface suitable for receiving energetic electromagnetic radiation, said thin layer comprising two or more sublayers of alternating first and second conductivity types, the intersection of said substrate with said thin layer and of said sublayers with one another forming a plurality of active junctions of alternating polarities thereacross in the direction normal to said upper surface and in planes essentially parallel to said upper surface;

c. an elongate zone of heavily doped said first conductivity type continuously extending from said upper surface and into conductive engagement with said substrate and with each sublayer of said first conductivity type, providing a low-impedance current path for majority carriers therefrom to said upper surface; and d. an elongate zone of heavily doped said second conductivity type continuously extending from said upper surface and into conductive engagement with each of said sublayers of said second conductivity type, providing a low-impedance current path for majority carriers therefrom to said upper surface.

46. A monolithic single-crystalline semiconductor body as recited in claim 45, further including means overlying at least a portion of said irradiated upper surface of said thin layer of single-crystalline semiconductor material for forming an inversion layer at said upper surface for capturing carriers thereat when exposed to blue light within the spectrum of said energetic electromagnetic radiation.

47. A monolithic single-crystalline semiconductor body as recited in claim 46, wherein said elongate zones of said first and said second conductivity types are widely spaced relative to one another, and wherein each of said elongate zones includes a plurality of narrow extensions thereof projecting in comb-like manner outwardly from its respective said main body zone toward said elongate zone of the opposite conductivity type and in interdigitated manner with said comb-like extensions of said elongate zone of the opposite conductivity type.

48. A method of forming a monolithic array of photovoltaic cells comprising the steps of:

a. forming a thin layer of single-crystalline semiconductor material overlying an insulating substrate body, said thin layer having a broad surface for receiving energetic electromagnetic radiation;

b. forming a broad active junction within said thin layer of single-crystalline semiconductor material defined by first and second conductivity type sublayers on opposing sides thereof, said active junction lying in a plane essentially parallel to said irradiated surface;

c. forming a plurality of elongate, generally parallel widely spaced zones of heavily doped said first conductivity type extending entirely across said thin layer in one lateral direction thereof and continuously extending from said upper irradiated surface into conductive engagement with said sublayer of said first conductivity type.

d. forming a plurality of generally parallel elongate widely spaced zones of heavily doped said second conductivity type extending entirely across said thin layer in one lateral direction thereof and extending continuously from said upper irradiated surface into conductive engagement with said sublayer of said second conductivity type, with at least one pair of said elongate zones of said first and said second conductivity types partially overlapping along their length; and e. extending into engagement with said insulating substrate those ones of said overlapping elongate zones having a conductivity type opposite to that of the lowermost sublayer of said thin layer of single-crystalline material, thereby simultaneously defining a plurality of series connected dielectrically isolated photovoltaic cells.

49. The method of forming a monolithic array of photovoltaic cells as recited in claim 48, wherein the step of forming said elongate zones of heavily doped said first conductivity type comprises the steps of masking said upper surface in the desired elongate shape of said elongate zones of said first conductivity type and diffusing high concentrations of said first conductivity type dopants through said masked upper surface and into said thin layer of semiconductor material; and wherein the step of forming said elongate zones of heavily doped said second conductivity type comprises the steps of masking said upper surface in the desired elongate shape of said elongate zones of said second conductivity type and diffusing high concentrations of said second conductivity type dopants through said masked upper surface and into said thin layer of semiconductor material.

50. A method of forming a monolithic array of photovoltaic cells comprising the steps of:

a. forming a thin layer of single-crystalline semiconductor material overlying an insulating substrate body, said thin layer having a broad surface for receiving energetic electromagnetic radiation;

b. forming a broad active junction within said thin layer of single-crystalline semiconductor material defined by first and second conductivity type sublayers on opposing sides thereof, said active junction lying in a plane essentially parallel to said irradiated surace;

c. forming a plurality of elongate, generally parallel widely spaced zones of heavily doped said first conductivity type extending entirely across said thin layer in one lateral direction thereof and continuously extending from said upper irradiated surface into conductive engagement with said sublayer of said first conductivity type;

d. forming a plurality of generally parallel elongate widely spaced zones of heavily doped said second conductivity type extending entirely across said thin layer in one lateral direction thereof and extending continuously from said upper irradiated surface into conductive engagement with said sublayer of said second conductivity type, with at least one pair of said elongate zones of said first and said second conductivity types being closely adjacent one another along their length;

e. extending into engagement with said insulating substrate those ones of said closely adjacent elongate zones having a conductivity type opposite to that of the lowermost sublayer of said thin layer of single-crystalline material, thereby simultaneously defining a plurality of dielectrically isolated photovoltaic cells; and f. connecting by means of an overlying metallization stripe at least one pair of said closely adjacent elongate zones, thereby connecting in series adjacent ones of said dielectrically isolated photovoltaic cells.

51. The method of forming a monolithic array of photovoltaic cells as recited in claim 50, wherein the step of forming said elongate zones of heavily doped said first conductivity type comprises the steps of masking said upper surface in the desired elongate shape of said elongate zones of said first conductivity type and diffusing high concentrations of said first conductivity type dopants through said masked upper surface and into said thin layer of semiconductor material; and wherein the step of forming said elongate zones of heavily doped said second conductivity type comprises the steps of masking said upper surface in the desired elongate shape of said elongate zones of said second conductivity type and diffusing high concentrations of said second conductivity type dopants through said masked upper surface and into said thin layer of semiconductor material.

52. A method of fabricating a photovoltaic cell, comprising the steps of:
  a. forming a thin layer of single-crystalline semiconductor material upon a relatively thick supportive substrate body, said thin layer having an upper surface for receiving energetic electromagnetic radiation;
  b. forming a plurality of sublayers within said thin layer of single-crystalline semiconductor material, said sublayers alternating between a first and a second conductivity type, the intersection of adjacent ones of said first and second conductivity type sublayers forming at least one active junction lying in a plane essentially parallel to and underlying a substantial portion of the area of said upper irradiated surface;
  c. forming an elongate heavily doped zone of said first conductivity type extending continuously from said irradiated surface into conductive engagement with said sublayers of first conductivity type; and
  d. forming an elongate heavily doped zone of said second conductivity type spaced from said elongate zone of said first conductivity type and extending from said upper irradiated surface into conductive engagement with said sublayers of said second conductivity type.

53. A method of fabricating a photovoltaic cell as recited in clam 52, including the step of forming a plurality of narrow comb-like extensions of each of said first and said second conductivity type elongate zones projecting from their respective said elongate zones in interdigitated manner.

54. A monolithic high-voltage solar cell array, comprising:
  a. a supportive substrate having at least an upper layer of electrically insulating material;
  b. a thin layer of single-crystalline semiconductor material directly overlying said supportive substrate and having an upper surface suitable for receiving energetic electromagnetic radiation, said thin layer having at least one sublayer each of first and second conductivity type materials respectively stacked upon one another to form at least one p-n junction lying in a plane essentially parallel to said irradiated upper surface;
  c. dielectrically insulating means for electrically isolating adjacent portions of said thin single-crystalline semiconductor layer to define at least two photovoltaic cell body structures;
  d. a plurality of first electrode zones of heavily doped said first conductivity type, at least one each of said first electrode zones being disposed in each of said photovoltaic cell body portions of said thin layer, each said first electrode zone extending continuously from said upper irradiated surface into conductive engagement with at least one of said sublayers of said first conductivity type to provide a low-impedance conductive path for majority carriers from said engaged sublayers of said first conductivity type to said upper irradiated surface; and
  e. a plurality of second electrode zones of heavily doped said second conductivity type, at least one each of said second electrode zones being disposed in each of said photovoltaic cell body portions of said thin layer, each said second electrode zone extending continously from said upper irradiated surface into conductive engagement with at least one of said sublayers of said second conductivity type to provide a low-impedance conductive path for majority carriers from said engaged sublayers of said second conductivity type to said upper irradiated surface.

55. A monolithic high-voltage solar cell array as recited in claim 54, wherein said dielectrically isolating means between at least a first and a second of adjacent ones of said photovoltaic cell body structures comprises:
  a. said first electrode zone of said first photovoltaic cell body structure extending entirely across said thin layer of single-crystalline semiconductor material in one lateral direction theoref, and continuously extending from said upper irradiated surface into conductive engagement with each of said sublayers of said first conductivity type;
  b. said second electrode zone of said second photovoltaic cell body structure being disposed closely adjacent and generally parallel to said first electrode zone of said first photovoltaic cell body structure and extending entirely across said thin layer of single-crystalline semiconductor material in said one lateral direction thereof, said second electrode zone of said second photovoltaic cell body structure continuously extending from said upper irradiated surface and into conductive engagement with each of said sublayers of said second conductivity type;
  c. that one of said first and said second electrode zones respectively of said first and said second photovoltaic cell body structures respectively, having a conductivity type opposite to that conductivity type of the lowermost sublayer of said thin layer, extending entirely through said thin layer of single-crystalline semiconductor material and into engagement with said substrate insulating material, to dielectrically isolate said first and said second photovoltaic body structures from one another.

56. A monolithic high-voltage solar cell array as recited in claim 55, wherein said first electrode zone of said first photovoltaic cell body structure and said second electrode zone of said second photovoltaic cell body structure partially overlap one another along their respective lengths.

57. A monolithic high-voltage solar cell array as recited in claim 54, wherein said dielectrically isolating means between at least a first and a second adjacent ones of said photovoltaic cell body structures comprises an insulating barrier member continously extending upwardly from said substrate insulating material and entirely through said thin single-crystalline semiconductor material to said upper irradiated surface thereof, and extending entirely across said thin layer in one lateral direction thereof, to directly dielectrically isolate said first and said second photovoltaic cell body structures from one another.

58. A monolithic high-voltage solar cell array as recited in claim 54, wherein said dielectrically isolating means for isolating at least a first of said photovoltaic cell body structures from adjacent ones of said structures comprises a receptacle-shaped dielectric barrier surrounding in moat-like manner that portion of said thin single-crystalline semiconductor material layer defining said first photovoltaic cell body structure, said receptacle-shaped dielectric barrier being disposed to surround said thin single-crystalline semiconductor layer on the lower and each side thereof except for said upper irradiated surface, to electrically isolate said first photovoltaic cell body structure from adjacent ones of said photovoltaic cell body structures.

59. A monolithic high-voltage solar cell array as recited in claim 54, wherein said first electrode zone extends across substantially the entire upper irradiated surface area of at least one of said photovoltaic cell body structures and comprises the uppermost sublayer of said thin single-crystalline semiconductor material layer.

* * * * *